US009048178B2

(12) United States Patent
Kubota et al.

(10) Patent No.: US 9,048,178 B2
(45) Date of Patent: Jun. 2, 2015

(54) PLASMA ETCHING METHOD AND SEMICONDUCTOR DEVICE MANUFACTURING METHOD

(71) Applicants: Kazuhiro Kubota, Miyagi (JP); Masanobu Honda, Miyagi (JP); Takayuki Katsunuma, Miyagi (JP)

(72) Inventors: Kazuhiro Kubota, Miyagi (JP); Masanobu Honda, Miyagi (JP); Takayuki Katsunuma, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/346,986

(22) PCT Filed: Sep. 25, 2012

(86) PCT No.: PCT/JP2012/074581
§ 371 (c)(1),
(2) Date: Mar. 25, 2014

(87) PCT Pub. No.: WO2013/047531
PCT Pub. Date: Apr. 4, 2013

(65) Prior Publication Data
US 2014/0234992 A1 Aug. 21, 2014

Related U.S. Application Data

(60) Provisional application No. 61/549,327, filed on Oct. 20, 2011, provisional application No. 61/549,350, filed on Oct. 20, 2011.

(30) Foreign Application Priority Data

Sep. 27, 2011 (JP) .................................. 2011-210945
Sep. 29, 2011 (JP) .................................. 2011-214927

(51) Int. Cl.
H01L 21/302 (2006.01)
H01L 21/66 (2006.01)
(Continued)

(52) U.S. Cl.
CPC ............ *H01L 22/26* (2013.01); *H01J 37/32449* (2013.01); *H01J 37/32724* (2013.01);
(Continued)

(58) Field of Classification Search
CPC ................ H01L 22/26; H01L 2122/30; H01L 2221/1015; H01L 2221/1036; H01L 21/76813; H01J 37/32449
USPC ......... 438/8, 9, 706, 710, 712, 714, 715, 716, 438/729, 730; 156/345.34, 345.35, 345.33, 156/345.26, 345.27, 345
See application file for complete search history.

(56) References Cited

U.S. PATENT DOCUMENTS 7,396,771 B2 * 7/2008 Miya et al. .................... 438/706
8,435,901 B2 * 5/2013 Zin ............................... 438/714
2008/0302781 A1 * 12/2008 Murakami et al. .......... 219/444.1

FOREIGN PATENT DOCUMENTS

JP 2007-250874 9/2007
JP 2008-047687 2/2008
(Continued)

Primary Examiner — Lan Vinh
(74) Attorney, Agent, or Firm — IPUSA, PLLC

(57) ABSTRACT

A plasma etching method is provided for etching a substrate corresponding to an etching object within an etching apparatus that includes a supply condition adjustment unit for adjusting a supply condition for supplying etching gas to the substrate, a temperature adjustment unit for adjusting a temperature of the substrate placed on a stage along a radial direction, and a plasma generating unit for generating plasma within a space between the supply condition adjustment unit and the stage. The plasma etching method includes a control step in which the temperature adjustment unit controls the temperature of the substrate to be uniform within a substrate plane of the substrate, and an adjustment step in which the supply condition adjustment unit adjusts a concentration distribution of active species contained in the plasma generated by the plasma generation unit within the space above the substrate.

12 Claims, 22 Drawing Sheets

(51) Int. Cl.
*H01J 37/32* (2006.01)
*H01L 21/311* (2006.01)
*H01L 21/768* (2006.01)

(52) U.S. Cl.
CPC .... *H01L21/31116* (2013.01); *H01L 21/76811* (2013.01); *H01L 21/76813* (2013.01); *H01L 2221/1015* (2013.01); *H01L 21/31144* (2013.01); *H01L 2924/0002* (2013.01)

(56) References Cited

FOREIGN PATENT DOCUMENTS

| | | |
|---|---|---|
| JP | 2008-141147 | 6/2008 |
| JP | 4701776 | 6/2011 |

\* cited by examiner

FIG.5
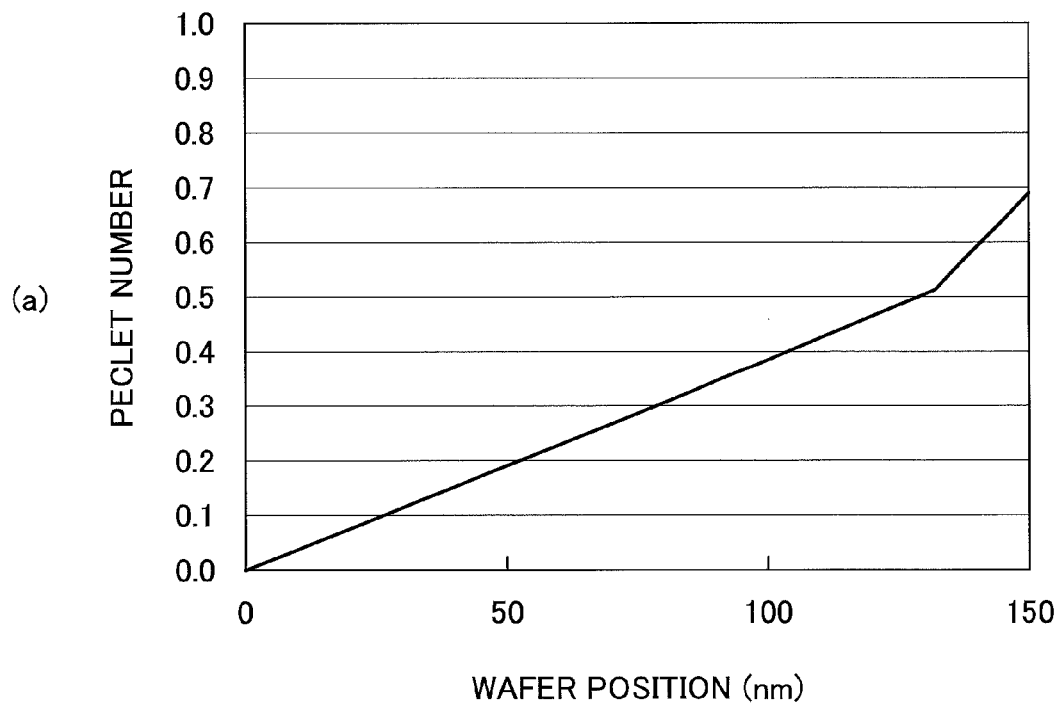
(a)
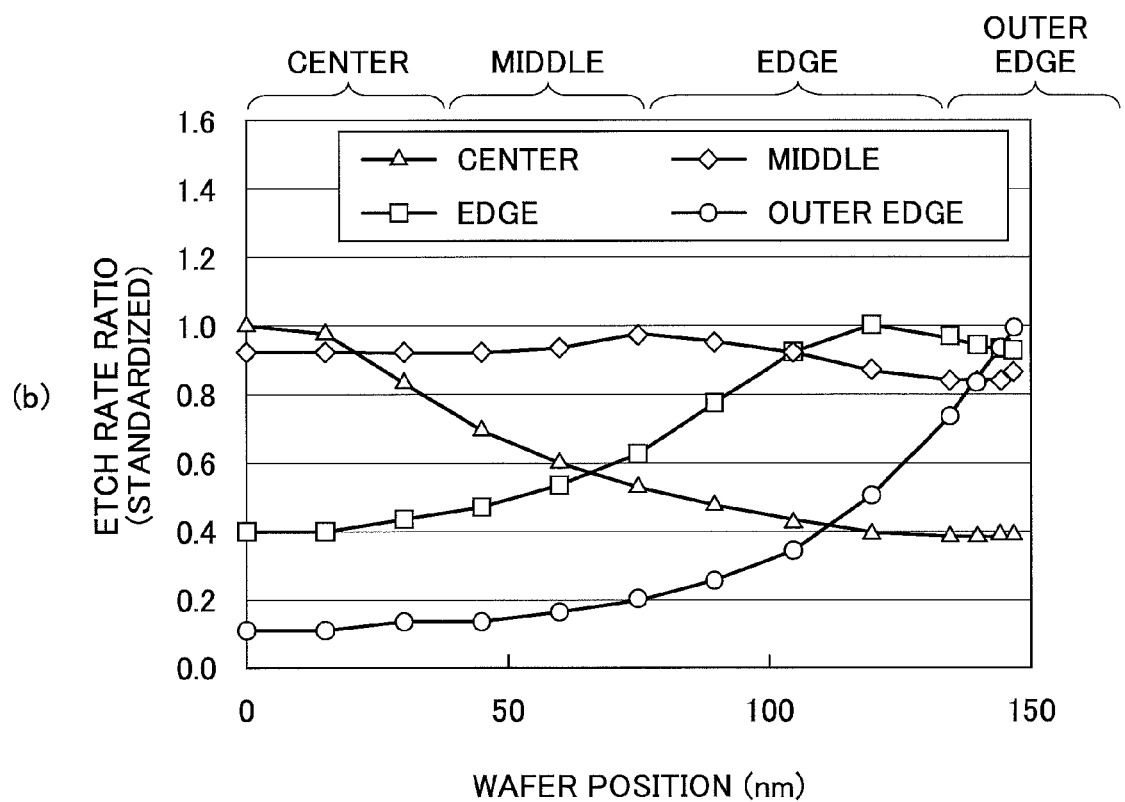
(b)

FIG.11
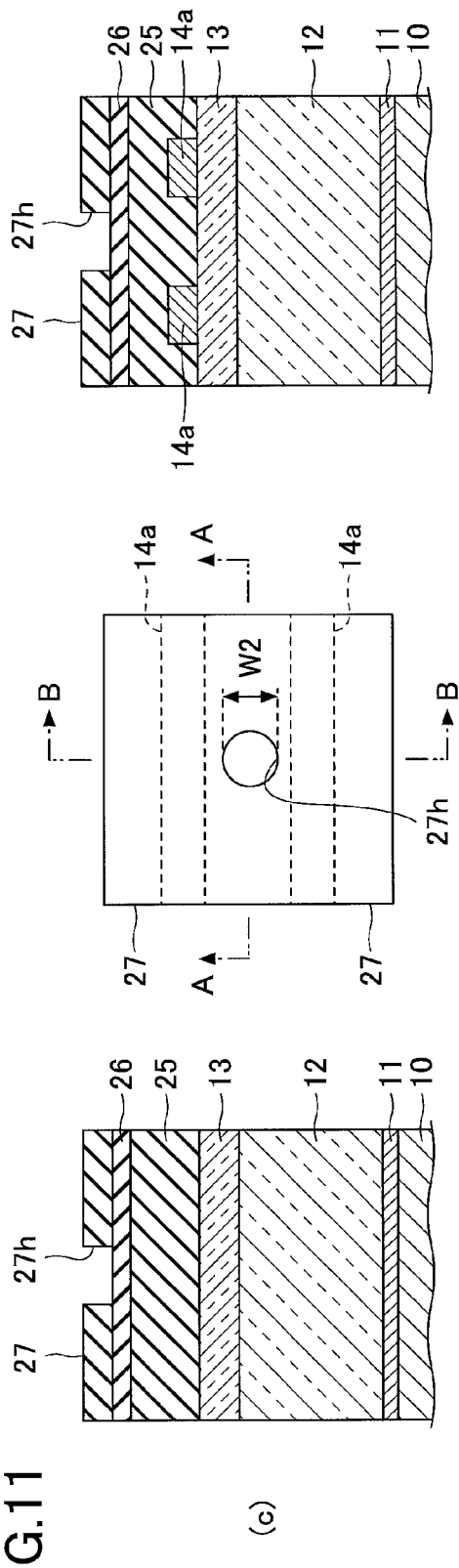
(c)
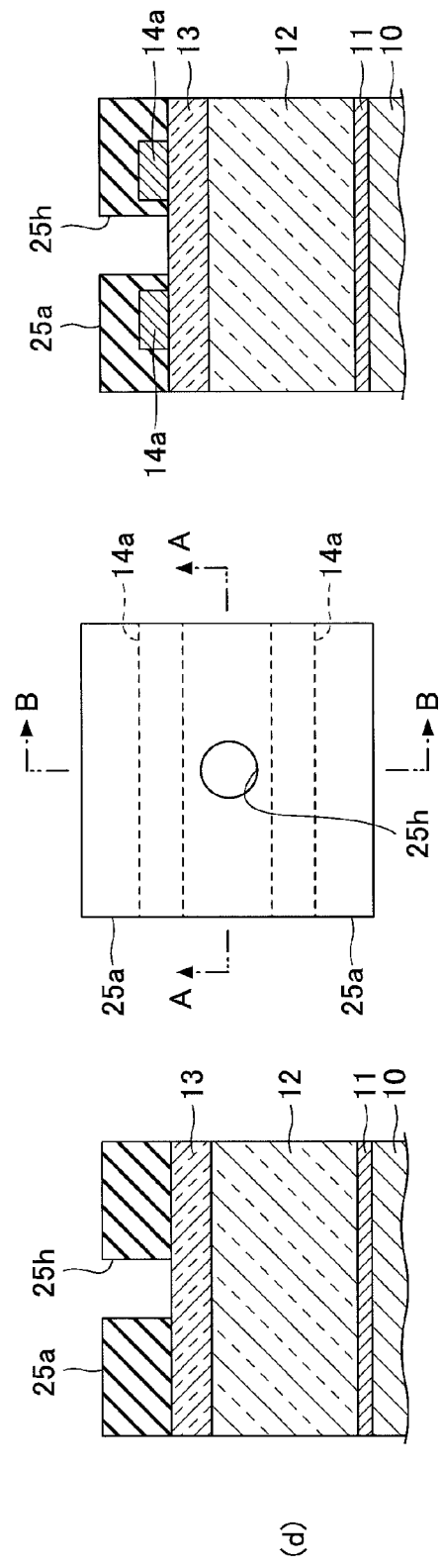
(d)

FIG.14
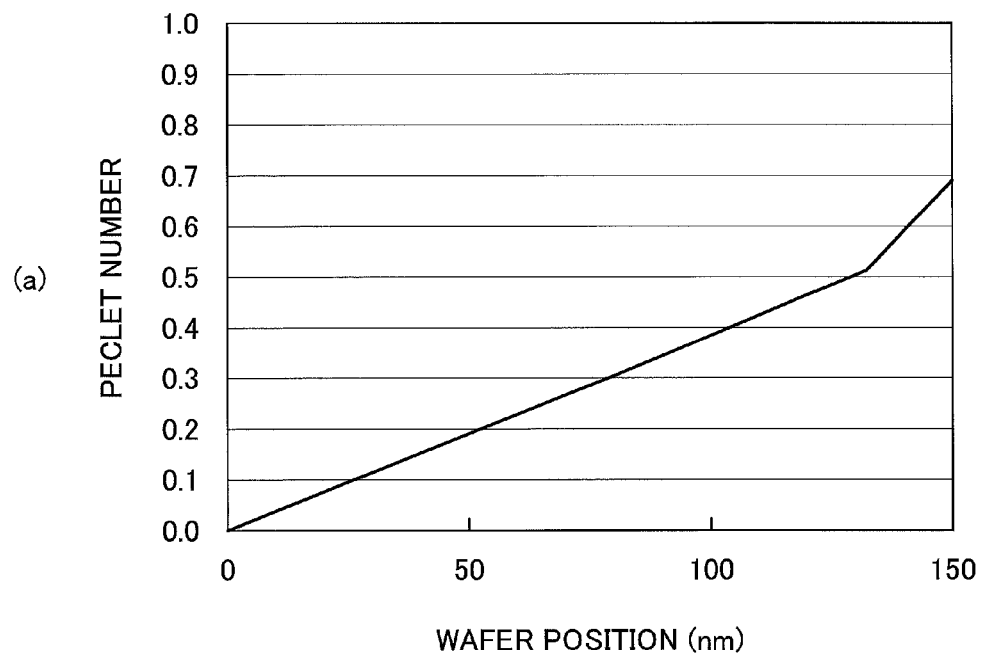
(a)
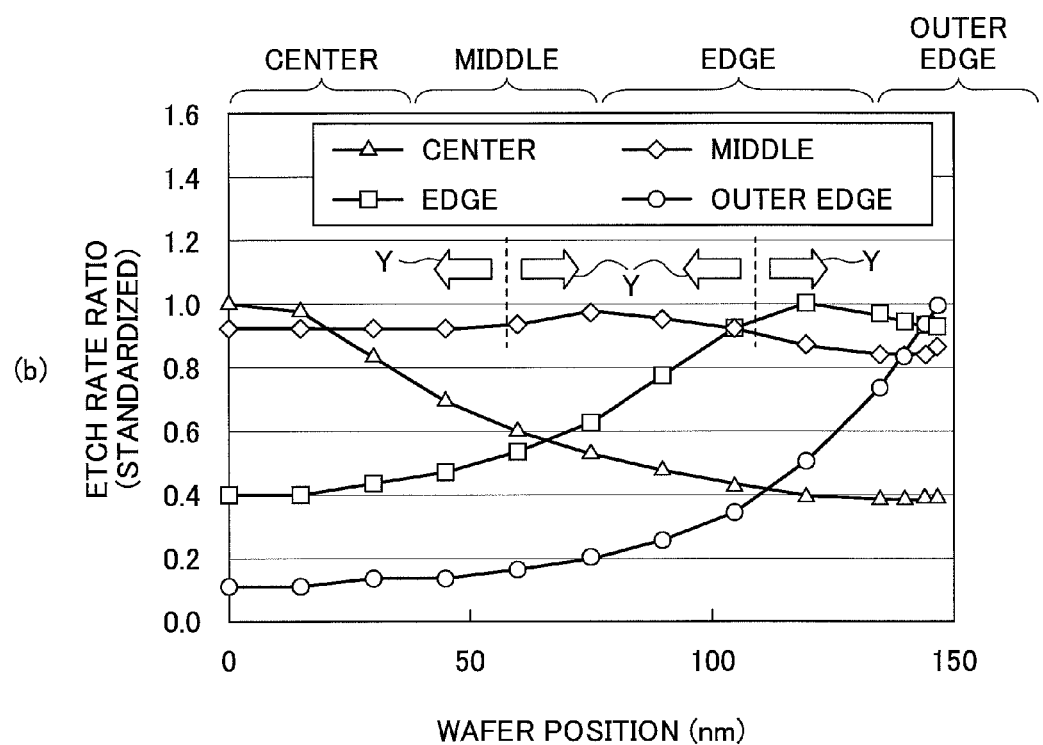
(b)

FIG.20
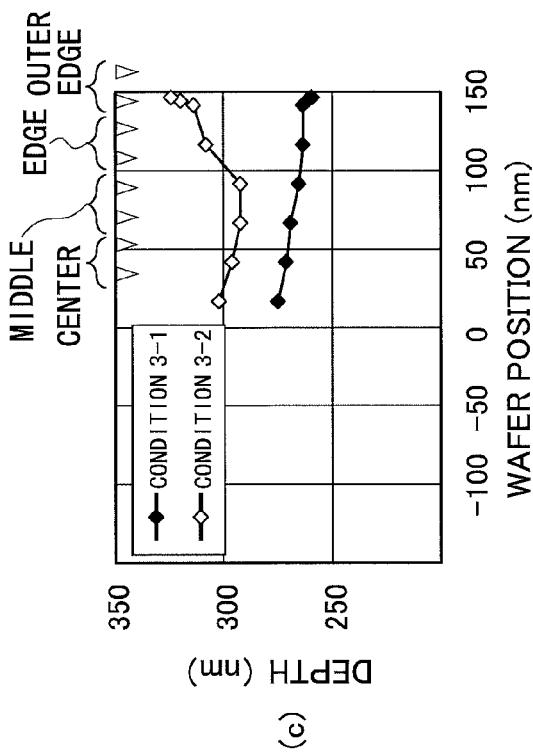
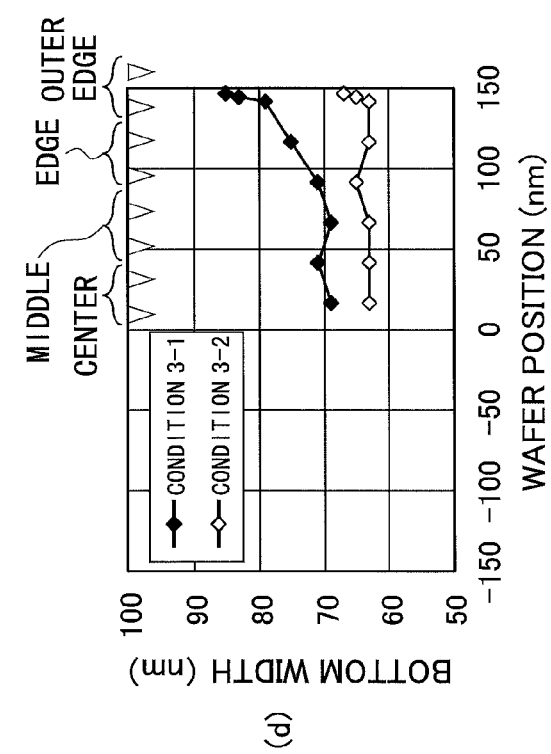
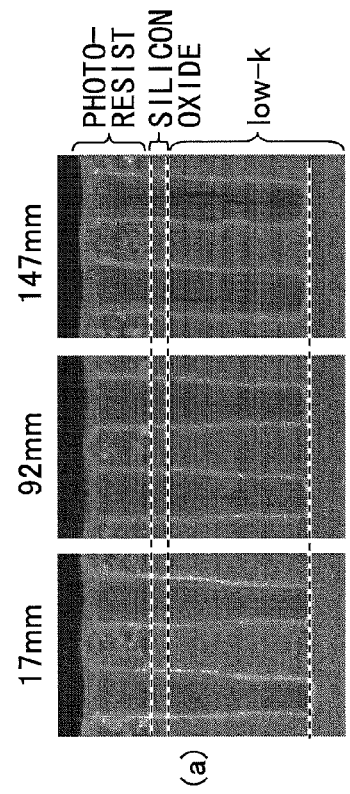
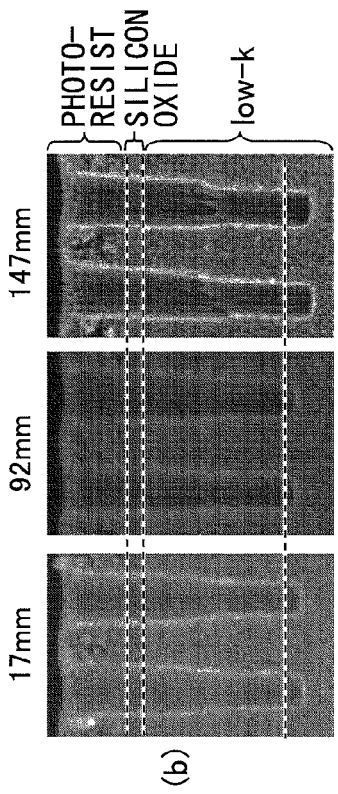

PLASMA ETCHING METHOD AND SEMICONDUCTOR DEVICE MANUFACTURING METHOD

CROSS-REFERENCE TO RELATED APPLICATIONS

The present application is a National Stage of International Application No. PCT/JP2012/074581 filed on Sep. 25, 2012, claiming priority based on Japanese Patent Application No. 2011-210945 filed on Sep. 27, 2011, Japanese Patent Application No. 2011-214927 filed on Sep. 29, 2011, U.S. Provisional Application No. 61/549,327 filed on Oct. 20, 2011 and U.S. Provisional Application No. 61/549,350 filed on Oct. 20, 2011, the entire contents of which are hereby incorporated by reference.

TECHNICAL FIELD

The present invention relates to a plasma etching method for etching an etching object by irradiating plasma on the etching object and a semiconductor device manufacturing method.

BACKGROUND ART

Plasma etching that involves irradiating plasma on an etching film (or etching substrate) to etch the film or substrate is an indispensable process for semiconductor device manufacturing. In plasma etching, etching gas is activated by a high frequency electric field to generate plasma. Plasma includes active species such as charged particles (referred to as "ion" hereinafter) and neutral particles (referred to as "radicals" hereinafter), for example. The surface of a wafer as the etching object reacts with the ions and radicals contained in the plasma to prompt the generation of reaction products, and etching of the wafer progresses as the reaction products are volatized.

In recent years, the diameters of wafer holes are becoming larger. As the wafer hole diameter is enlarged, it becomes increasingly difficult to ensure in-plane etch rate uniformity within a wafer plane. Techniques are known for improving in-plane uniformity within a wafer plane by controlling the density of active species within a center region and an edge region of a wafer plane through adjustment of the etching gas supply rate of etching gas supplied from an upper electrode (see e.g., Patent Document 1).

PRIOR ART DOCUMENTS

Patent Document 1: Japanese Patent No. 4701776

SUMMARY OF THE INVENTION

Problem to be Solved by the Invention

In the case of forming via holes or trenches within a wafer through plasma etching, etching conditions (processing gas supply rate, pressure within chamber during etching, wafer temperature, etc.) are adjusted to ensure in-plane uniformity of the depths and widths of the via holes and trenches formed within the wafer. For example, before starting device manufacturing, a test wafer may be etched in a preliminary experiment. If a via hole width (inner diameter) is smaller at an edge region of the wafer and becomes larger at a center region of the wafer, etching conditions may be adjusted to correct such a disparity. However, even if uniformity of the via hole width within the wafer plane may be achieved by adjusting the processing gas supply rate, for example, disparities in the via hole depth within the wafer plane may increase as a result of such an adjustment. That is, it is difficult to independently control profile parameters (e.g., width, diameter, depth) of via holes and trenches, and thus, it is difficult to achieve uniformity in the etching profiles of via holes and trenches within a wafer plane.

In light of the above problems, one object of the present invention is to provide a plasma etching method that can achieve uniformity in the etching profiles of via holes and trenches within a wafer plane.

Means for Solving the Problem

According to a first embodiment of the present invention, a plasma etching method is provided for etching a substrate corresponding to an etching object within an etching apparatus that includes a supply rate adjustment unit for adjusting a supply rate of etching gas supplied to the substrate, a temperature adjustment unit for adjusting a temperature of the substrate placed on a stage along a radial direction, and a plasma generating unit for generating plasma within a space between the supply rate adjustment unit and the stage. The plasma etching method includes a control step in which the temperature adjustment unit controls the temperature of the substrate to be uniform within a substrate plane of the substrate at a first temperature, and an adjustment step in which the supply rate adjustment unit adjusts a concentration distribution of active species contained in the plasma generated by the plasma generation unit within the space above the substrate.

According to a second embodiment of the present invention, a plasma etching method is provided for etching a substrate that includes a first wiring layer on which an insulating layer and a metal layer are successively formed, a metal mask layer having a first opening for defining a trench for a second wiring layer, and a second mask layer having a second opening that is smaller than the first opening for defining a via for interconnecting the first wiring layer and the second wiring layer. The first opening is formed by etching the metal layer formed on the first wiring layer, and the second opening is formed by etching a planarization layer arranged on the insulating layer and covering the metal mask layer. The plasma etching method includes a first etching step of performing plasma etching on the insulating layer using the second mask layer and forming an opening having a depth that is less than a thickness of the insulating layer within a plasma etching apparatus, and a second etching step of performing plasma etching on the insulating film using the metal mask layer to form the trench and deepening the opening to form the via within the same plasma etching apparatus. The first etching step and the second etching step include adjusting an etching gas supply condition according to whether a supply position on the substrate corresponds to a position where an effect of diffusion of supplied etching gas is greater than an effect of flow of supplied etching gas, or a position where an effect of flow of supplied etching gas is greater than an effect of diffusion of supplied etching gas.

Advantageous Effect of the Invention

According to an aspect of the present invention, a plasma etching method may be provided that can achieve uniformity in the etching profiles of via holes and trenches within a wafer plane.

BRIEF DESCRIPTION OF THE DRAWINGS

FIG. 5 illustrates the Peclet number and the etch rate at wafer positions in another exemplary case of implementing a plasma etching method according to an embodiment of the present invention;

FIG. 11 illustrates top views (center) and cross-sectional views (left and right) of structures formed in processes of the plasma etching method of the second embodiment (continued from FIG. 10);

FIG. 14 illustrates the Peclet number and the etch rate at wafer positions in another exemplary case of implementing a plasma etching method according to an embodiment of the present invention;

FIG. 20 illustrates other experimental results;

DESCRIPTION OF REFERENCE NUMERALS

Figure 1:
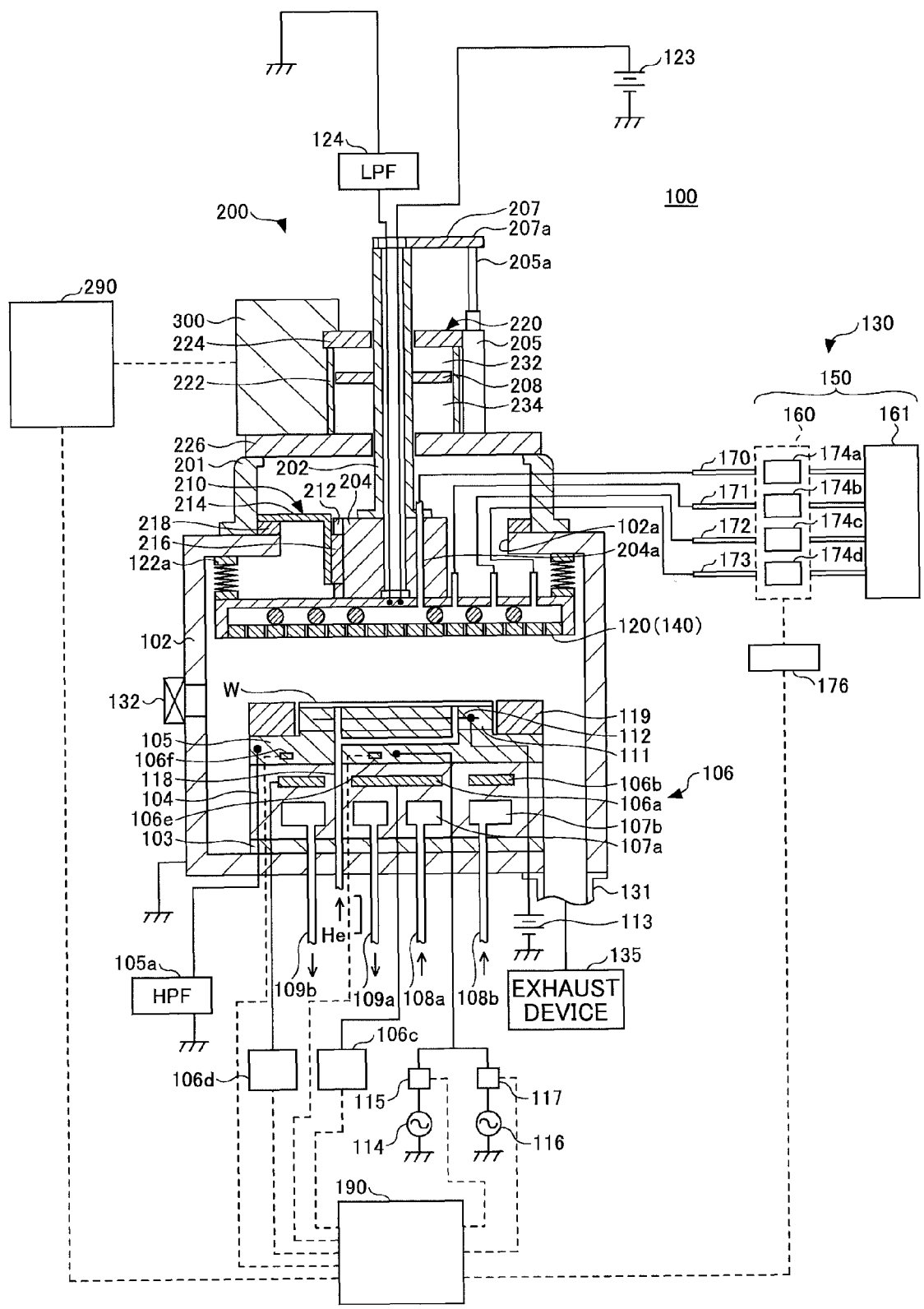
FIG. 1 illustrates an exemplary configuration of a plasma etching apparatus that may be used in implementing a plasma etching method according to an embodiment of the present invention.

W wafer
105 susceptor (stage)
106 temperature distribution adjustment unit
120 upper electrode
122 belows
130 gas supply condition adjustment unit
140 shower head
143 buffer chamber
145 annular partition wall member
150 gas supply device
190 device control unit
200 upper electrode drive unit

EMBODIMENTS FOR IMPLEMENTING THE INVENTION

First Embodiment

In the following, a first embodiment of the present invention is described with reference to the accompanying drawings.

(Plasma Etching Apparatus Configuration)

First, referring to FIG. 1, a plasma etching apparatus 100 that may be used for implementing a plasma etching method according to the present embodiment is described.

As illustrated in FIG. 1, the plasma etching apparatus 100 of the present embodiment includes a cylindrical chamber (processing chamber) 102 made of aluminum having an alumite-treated (anodized) surface, for example. The chamber 102 is grounded.

A substantially cylindrical susceptor support 104 is arranged at a bottom portion within the chamber 102 via an insulating plate 103 made of ceramic, for example. A susceptor 105 corresponding to a lower electrode is arranged on the susceptor support 104. The susceptor 105 is grounded via a high pass filter (HPF) 105a.

The susceptor 105 has an upper side center portion arranged into a convex circular plate shape. An electrostatic chuck 111 having substantially the same shape as a wafer W corresponding to a processing object (etching object) is arranged on this circular plate shaped portion. The electrostatic chuck 111 is made of an insulating material and has an electrostatic electrode 112 interposed between the insulating material. The electrostatic chuck 111 is a circular plate shaped ceramic member, and the electrostatic electrode 112 is connected to a DC power supply 113. For example, when a DC voltage of 1.5 kV is supplied from the DC power supply 113 to the electrostatic electrode 112, the wafer W may be electrostatically attracted to the electrostatic chuck 111 by a Coulomb force or a Johnsen-Rahbek force.

A first high frequency power supply 114 is connected to the susceptor 105 via a first matching unit 115, and a second high frequency power supply 116 is connected to the susceptor 105 via a second matching unit 117. The first high frequency power supply 114 supplies to the susceptor 105 a high frequency power for biasing having a relatively low frequency of 13.6 MHz, for example. The second high frequency power supply 116 supplies to the susceptor 105 a high frequency power for plasma generation having a relatively high frequency of 40 MHz, for example. In this way, the susceptor 105 can supply power for plasma generation within the chamber 102.

A gas passageway 118 for supplying a heat transfer medium (e.g., backside gas such as He gas) to the backside of the wafer W is arranged to extend through the insulating plate 103, the susceptor support 104, the susceptor 105, and the electrostatic chuck 111. Heat may be exchanged between the susceptor 105 and the wafer W via such a heat transfer medium so that the wafer W may be maintained at a predetermined temperature.

An annular focus ring 119 is arranged on an upper edge portion of the susceptor 105 to surround the wafer W that is placed on the electrostatic chuck 111. The focus ring 119 may be made of a dielectric material such as ceramic or quartz, or a conductive material such as a single crystal silicon. For example, the focus ring 119 may be made of the same conductive material as the wafer W.

By expanding a plasma distribution range to the focus ring 119, the plasma density at an edge portion of the wafer W may be maintained substantially the same as the plasma density at a center portion of the wafer W. In this way, plasma etching uniformity within a wafer plane may be improved.

An upper electrode 120, which also acts as a shower head 140 for supplying etching gas toward the wafer W held by the susceptor 105 (described below), is arranged above the susceptor 105 to be substantially parallel to the susceptor 105. The upper electrode 120 is connected to a DC power supply 123. The upper electrode 120 is grounded via a low pass filter (LPF) 124.

The upper electrode 120 may be driven by an upper electrode drive unit 200 to move in the vertical direction, for example. By arranging the upper electrode 120 to be movable in the vertical direction, a distance between the upper electrode 120 and the susceptor 105 (referred to as "gap G" hereinafter) may be adjusted. The gap G is a parameter that has a substantial influence on the diffusion and flow of etching gas. Accordingly, by enabling adjustment of the gap G, the plasma distribution at a space between the upper electrode 120 and the susceptor 105 within the chamber 102 may be controlled. For example, the gap G is preferably adjusted to be relatively wide so that ions within the plasma may be moved toward the susceptor 105 and irradiated in a direction substantially perpendicular to the wafer W by the plasma power applied to the susceptor 105. In this case, the ions contribute to etching in a direction substantially perpendicular to the wafer W.

Note that the displacement of the upper electrode 120 that is driven by the upper electrode drive unit 200 is not particularly limited. For example, the displacement of the upper electrode 120 may be 70 mm, and the gap G may be adjusted to be within a range of 20 mm to 90 mm.

Also, although the plasma etching apparatus 100 of the present embodiment has the wafer W placed on the susceptor 105 with its etching side facing upward and is configured to supply etching gas to the wafer W from the shower head 140 arranged above the susceptor 105, in other embodiments, a plasma etching apparatus may have a susceptor arranged to hold a wafer in a vertical direction and have a shower head arranged to supply etching gas to the wafer held by the susceptor from a lateral direction. In yet another embodiment, a plasma etching apparatus may have a susceptor arranged to hold a wafer such that its etching side faces downward, and a shower head arranged below the susceptor to supply etching gas to the wafer held facing downward by the susceptor.

The upper electrode 120 is supported by an upper inner wall of the chamber 102 via bellows 122. The bellows 122 are attached by fixing means such as bolts to the upper inner wall of the chamber 102 via an annular upper flange 122a. Also, the bellows 122 are attached by fixing means such as bolts to the surface of the upper electrode 120 via an annular upper flange 122b.

In the following, the upper electrode drive unit 200 for adjusting the gap G is described. The upper electrode drive unit 200 includes a substantially cylindrical support member 204 that supports the upper electrode 120. The support member 204 is attached to an upper center portion of the upper electrode 120 by fixing means such as a bolt.

The support member 204 is arranged to be movable in and out of a hole 102a formed around a center portion of an upper wall of the chamber 102. An outer peripheral face of the support member 204 is supported by a slide mechanism 210 inside the hole 102a of the chamber 102.

The slide mechanism 210 includes a fixing member 214 that is L-shaped in cross section, a guide member 216 that is fixed to a vertical portion of the fixing member 214 at an upper part of the chamber 102, and a rail part 212 arranged in one direction (vertical direction in the present example) on the outer peripheral face of the support member 204 to be slidably supported by the guide member 216.

The fixing member 214 that fixes the guide member 216 of the slide mechanism 210 is fixed to the upper part of the chamber 102 via a horizontal adjustment plate 218 having an annular horizontal portion. A horizontal positioning of the upper electrode 120 may be adjusted by the horizontal adjustment plate 218.

The horizontal adjustment plate 218 may be fixed to the chamber 102 by bolts that are arranged equidistantly around the horizontal adjustment plate 218, for example. A tilt of the horizontal adjustment plate 218 with respect to the horizontal direction may be adjusted by adjusting how much the bolts are protruding, for example. By adjusting the tilt of the horizontal adjustment plate 218 with respect to the horizontal direction and adjusting a tilt of the guide member 216 of the slide mechanism 210 with respect to the vertical direction, a tilt of the upper electrode 120 in the horizontal direction may be adjusted. That is, the upper electrode 120 may be constantly maintained horizontal.

An air pressure cylinder 220 for driving the upper electrode 120 is attached to the upper side of the chamber 102 via a cylindrical body 201. That is, the bottom edge of the cylindrical body 201 is hermetically sealed to the upper side of the chamber 102 by bolts, for example, to cover the hole 102a. The top edge of the cylindrical body 201 is hermetically sealed to the bottom edge of the air pressure cylinder 220.

The air pressure cylinder 220 includes a rod 202 that may be driven to move in one direction. The bottom end of the rod 202 may be connected to an upper center portion of the support member 204 by a bolt, for example. When the rod 202 is driven, the upper electrode 120 is driven by the support member 204 to move along the slide mechanism 210. The rod 202 may have a cylindrical structure, for example, and an internal space of the rod 202 communicates with a center hole formed at a center portion of the support 204 and is released to the atmosphere. In this way, wiring that is grounded via the upper electrode 120 and the low pass filter (LPF) 124, and a power supply line for supplying a DC voltage to the upper electrode 120 from the DC power supply 123 may be connected to the upper electrode 120 via the internal space of the rod 202 and the center hole of the support member 204.

Also, a position detector such as a linear encoder 205 for detecting the position of the upper electrode 120 is arranged at a side of the air pressure cylinder 220. A top end member 207 including an extending portion 207a extending sideways from the rod 202 is arranged at the top end of the rod 202. The extending portion 207a of the top end member 207 and a position detection unit 205a of the linear encoder 205 are arranged to be in contact with each other. The top end member 207 moves in conjunction with the upper electrode 120. Thus, the linear encoder 205 may detect the position of the upper electrode 120.

The air pressure cylinder 220 includes a cylinder main body 222, an upper support plate 224, and a lower support plate 226. The cylinder main body 222 is interposed between the upper support plate 224 and the lower support plate 226. An annular partition member 208 for partitioning the internal space of the air pressure cylinder 220 into an upper space 232 and a lower space 234 is arranged around an outer peripheral face of the rod 202.

Compressed air is introduced into the upper space 232 of the air pressure cylinder 220 from an upper port 236 of the upper support plate 224. Compressed air is introduced into the lower space 234 of the air pressure cylinder 220 from a lower port 238 of the lower support plate 226. By controlling the amount of air introduced into the upper space 232 and the lower space 234 from the upper port 236 and the lower port 238, the rod 202 may be driven and controlled to move in one direction (e.g., vertical direction). The amount of air introduced into the air pressure cylinder 220 is controlled by an air pressure circuit 300 arranged near the air pressure cylinder 220.

The upper electrode drive unit 200 also includes a control unit 290, which is connected to a device control unit 190. A control signal from the device control unit 190 is transmitted to the control unit 290, and in turn, the control unit 290 controls drive operations of various components of the upper electrode drive unit 200.

A temperature distribution adjustment unit 106 for adjusting an in-plane temperature distribution of the wafer W is arranged within the susceptor support 104. The temperature distribution adjustment unit 106 includes heaters 106a and 106b, heater power supplies 106c and 160d, thermometers 106e and 106f, and coolant paths 107a and 107b.

The susceptor support 104 has the heater 106a arranged at the center side and the heater 106b arranged at the outer side. The center side heater 106a is connected to the center side heater power supply 106c, and the outer side heater 106b is connected to the outer side heater power supply 106d. The center side heater power supply 106c and the outer side heater power supply 106d are capable of independently adjusting the power supplied to the center side heater 106a and the outer side heater 106b, respectively. In this way, a temperature distribution may be created at the susceptor support 104 and the susceptor 105 along the radial direction of the wafer W. That is, the temperature distribution along the radial direction of the wafer W may be adjusted.

Also, the susceptor support 104 has the thermometer 106e arranged at the center side and the thermometer 106f arranged at the outer side. The center side thermometer 106e and the outer side thermometer 106f measure temperatures of the susceptor support 104 at the center side and the outer side, respectively. In this way, the center side thermometer 106e and the outer side thermometer 106f may derive temperatures at the center side and the outer side of the wafer W. The temperatures measured by the center side thermometer 106e and the outer side thermometer 106f are transmitted to the device control unit 190. The device control unit 190 adjusts outputs of the center side heater power supply 106c and the outer side heater power supply 106d so that the temperatures of the wafer W derived from the measured temperatures reach their target temperatures.

The susceptor support 104 may also have the coolant path 107a arranged at the center side and the coolant path 107b arranged at the outer side. The center side coolant path 107a and the outer side coolant path 107b may be arranged to circulate coolants such as cooling water or fluorocarbon coolants at different temperatures, for example. To circulate the coolants, a coolant is introduced into the coolant path 107a via a center side introduction pipe 108a and is discharged via a center side discharge pipe 109a. Also, a coolant is introduced into the outer side coolant path 107b via an outer side introduction pipe 108b and is discharged via an outer side discharge pipe 109b.

The temperature of the susceptor 105 is adjusted through heating by the heaters 106a and 106b, and cooling by the coolants. Accordingly, the wafer W is adjusted to a predetermined temperature by heat from plasma radiation and irradiation of ions included in the plasma, and heat exchange with the susceptor 105. Note that because the susceptor support 104 has the center side heater 106a (and center side coolant path 107a) and the outer side heater 106b (and outer side coolant path 107b), the temperatures of the wafer W at the center side and the outer side may be independently adjusted.

Also, although not illustrated in FIG. 1, a heat insulating layer such as a heat insulating material or a space may be provided between the center side heater 106a and the outer side heater 106b or the center side coolant path 107a and the outer side coolant path 107b. By providing such a heat insulating layer, heat insulation may be achieved between the center side heater 106a and the outer side heater 106b or the center side coolant path 107a and the outer side coolant path 107b. That is, a greater heat distribution may be created between the center side and the outer side of the wafer W.

An exhaust pipe 131 is connected to a bottom portion of the chamber 102, and an exhaust device 135 is connected to the exhaust pipe 131. The exhaust device 135 includes a vacuum pump such as a turbo-molecular pump for adjusting the internal pressure within the chamber 102 to a reduced-pressure atmosphere (e.g., 0.67 Pa or lower). Also, a gate valve 132 is arranged at a side wall of the chamber 102. The gate valve 132 may be opened to allow the wafer W to be transferred into and out of the chamber 102. Note that a transfer arm may be used to transfer the wafer W, for example.

(Configuration of Adjustment Unit for Adjusting Etching Gas Supply Conditions)

In the following an exemplary configuration of a gas supply condition adjustment unit 130 for adjusting gas supply conditions for supplying etching gas to the wafer W held by the susceptor 105 is described. The gas supply condition adjustment unit 130 includes the shower head 140, which is integrated with the upper electrode 120, and the gas supply device 150.

Figure 2:
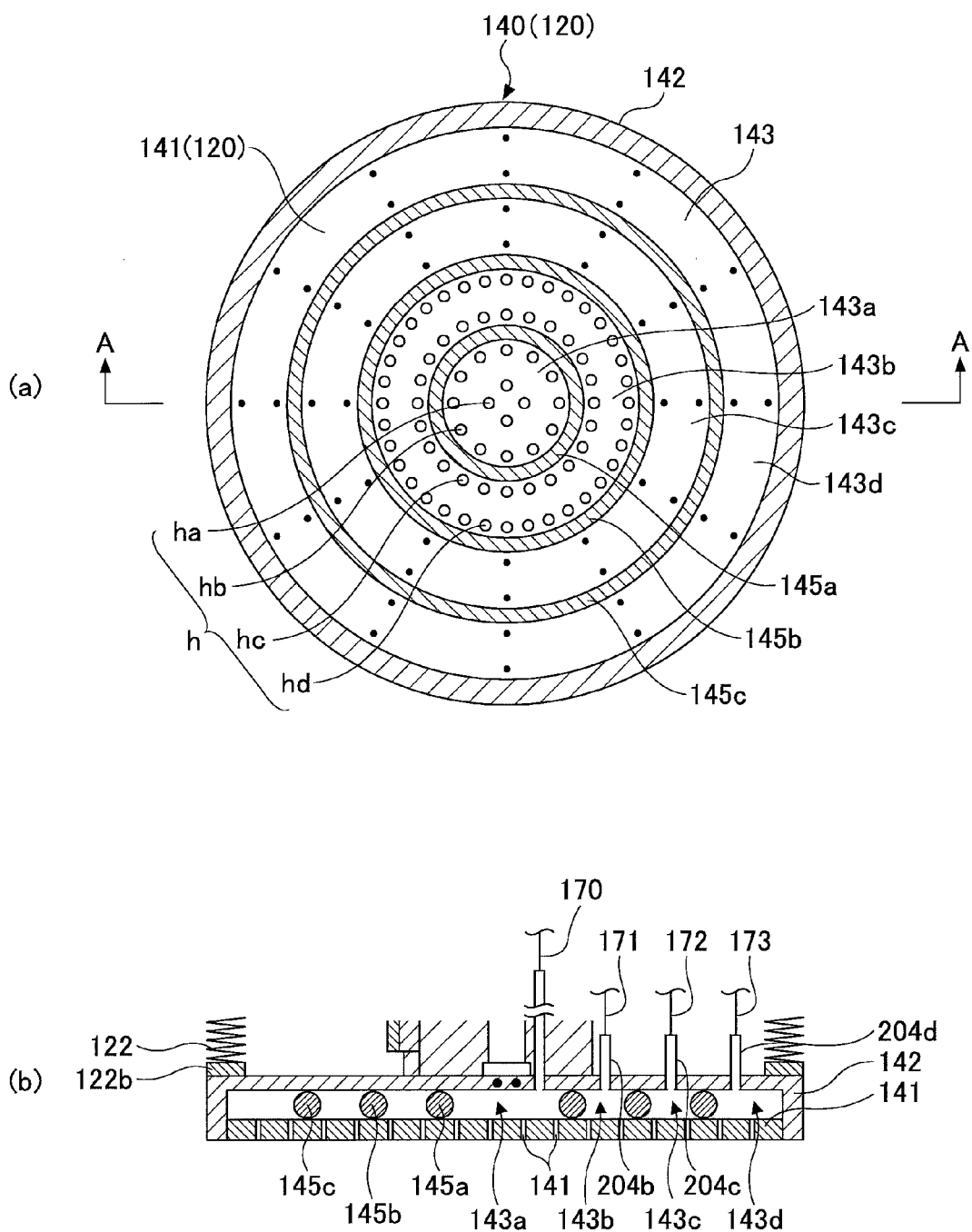
FIG. 2 illustrates an exemplary configuration of a shower head of the plasma etching apparatus illustrated in FIG. 1.

FIG. 2 illustrates an exemplary configuration of the shower head 140. As illustrated in FIG. 2, the shower head 140 includes a circular electrode plate 141 (upper electrode 120) having multiple gas spray holes h (ha-hd) and an electrode support 142 that detachably supports an upper face side of the electrode plate 141. The electrode support 142 is arranged into a circular disk shape having the same diameter as the electrode plate 141. A circular buffer chamber 143 is formed within the electrode support 142.

As illustrated in FIG. 2 (a), the buffer chamber 143 has one or more annular partition wall members 145 forming O-rings arranged on the electrode plate 141. In the illustrated example, three annular partition wall members 145a, 145b, and 145c with differing diameters are concentrically arranged on the electrode plate 141. In this way, the buffer chamber 143 is divided into a center region 143a, a middle region 143b, an edge region 143c, and an outer edge region 143d along the radial direction of the electrode plate 141.

Also, as illustrated in FIG. 2 (b), the regions 143a-143d are each connected to the gas supply device 150, and in this way, etching gas may be supplied from the gas supply device 150 to each of the regions 143a-143d. The etching gas supplied to the regions 143a-143d is sprayed onto the wafer W held by the susceptor 105 via corresponding gas spray holes h.

Note that the number and layout of the spray holes h are preferably arranged such that etching gas may be evenly sprayed on the wafer W. Although not limited to the following, the gas spray holes h may be arranged along the circumferences of multiple concentric circles drawn concentrically around the center of the shower head 140 (electrode plate 141), for example. In one specific example, in a case where a wafer W with a diameter of 300 mm is used, the center region 143a may have four gas spray holes ha arranged (e.g., equidistantly) along the circumference of a 11-mm-radius circle, and twelve gas spray holes hb arranged (e.g., equidistantly) along the circumference of a 33-mm-radius circle. The middle region 143b may have twenty-four (24) gas spray holes hc arranged (e.g., equidistantly) along the circumference of a 55-mm-radius, and thirty-six (36) gas spray holes hd arranged (e.g., equidistantly) along the circumference of a 77-mm-radius circle. The edge region 143c may have forty-eight (48) gas spray holes (not shown) arranged (e.g., equidistantly) along the circumference of a 99-mm-radius circle, and sixty (60) gas spray holes (not shown) arranged (e.g., equidistantly) along the circumference of a 121-mm-radius circle. The outer edge region 143d may have eighty (80) gas spray holes (not shown) arranged (e.g., equidistantly) along the circumference of a 143-mm-radius circle, and one hundred (100) gas spray holes (not shown) arranged (e.g., equidistantly) along the circumference of a 165-mm-radius circle.

Figure 3:
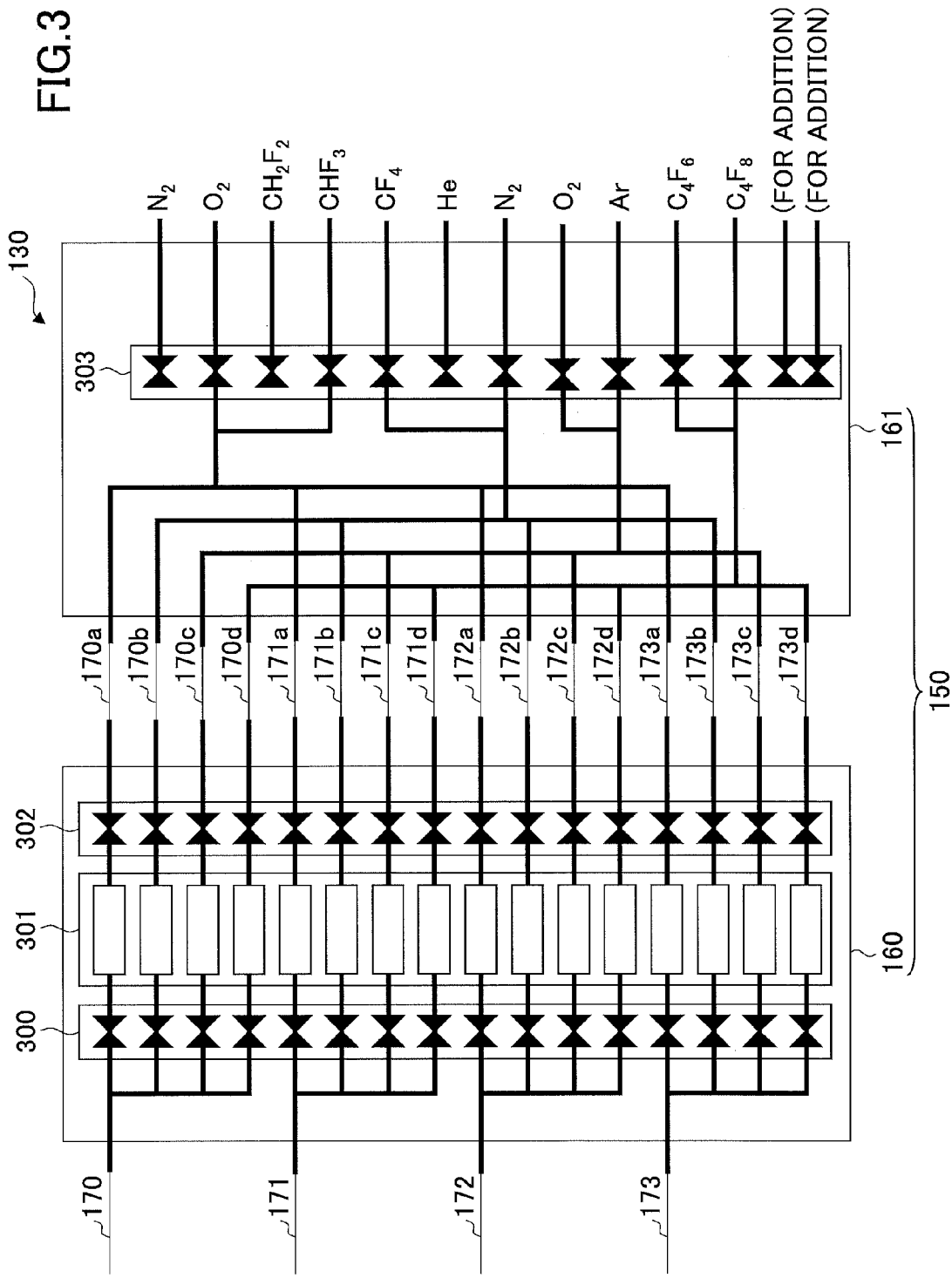
FIG. 3 illustrates an exemplary configuration of a gas supply device of the plasma etching apparatus illustrated in FIG. 1.

In the following, referring to FIG. 3, the gas supply device 150 and a gas supply system for individually supplying etching gas to the regions 143a-143d of the buffer chamber 143 are described. As illustrated in FIG. 3, the gas supply device 150 includes a first gas box 161 and a second gas box 160. The first gas box 161 accommodates a first group of valves 303 that are connected to a plurality of gas supply sources (not shown). The second gas box accommodates a second group of valves 302, flow rate controllers 301 such as mass flow controllers for the individual valves of the second group of valves 302, and a third group of valves 303.

In the present embodiment, the gas supply sources include fluorocarbon-based fluorine compound (CF) gases such as $CF_4$ gas, $C_4F_6$ gas, $C_4F_8$ gas, $CH_2F_2$ gas, and $CHF_3$ gas, for example. Also, the gas supply sources include gas for controlling adhesion of reaction products of the CF gases such as oxygen ($O_2$) gas. Further, the gas supply sources include carrier gases such as Ar gas, $N_2$ gas, and He gas, for example.

Pipes extending from the gas supply sources are connected to corresponding valves of the first group of valves 303 within the first gas box 161. Also, in the present embodiment, a $CHF_3$ gas pipe and an $O_2$ gas pipe merge at the downstream side of the first group of valves 303, and the merged pipe then branches out into four branch pipes 170a, 171a, 172a, and 173a. By controlling the first group of valves 303, $CHF_3$ gas, $O_2$ gas, or a mixture thereof may flow into the branch pipes 170a-173a.

Similarly, a $CF_4$ gas pipe and a $N_2$ gas pipe merge at the downstream side of the first group of valves 303, and the merged pipe then branch out to four branch pipes 170b, 171b, 172b, and 173b. By controlling the first group of valves 303, $CF_4$ gas, $N_2$ gas, or a mixture thereof may flow into the branch pipes 170b-173b.

Similarly, an $O_2$ gas pipe and an Ar gas pipe merge at the downstream side of the first group of valves 303, and the merged pipe then branch out to four branch pipes 170c, 171c, 172c, and 173c. By controlling the first group of valves 303, $O_2$ gas, Ar gas, or a mixture thereof may flow into the branch pipes 170c-173c.

Similarly, a $C_4F_6$ gas pipe and a $C_4F_8$ gas pipe merge at the downstream side of the first group of valves 303, and the merged pipe then branch out to four branch pipes 170d, 171d, 172d, and 173d. By controlling the first group of valves 303, $C_4F_6$ gas, $C_4F_8$ gas, or a mixture thereof may flow into the branch pipes 170d-173d.

The branch pipes 170a-173a, 170b-1703b, 170c-173c, and 170d-173d are connected to corresponding valves of the second group of valves 302 and further connected to corresponding valves of the first group of valves 300 via flow rate controllers 301 within the second valve box 160.

Pipes corresponding to the branch pipes 170a, 170b, 170c, and 170d merge into pipe 170 at the downstream side of the first group of valves 303, and the pipe 170 communicates with the center region of 143a of the shower head 140 (see FIG. 2 (b)). Pipes corresponding to the branch pipes 171a, 171b, 171c, and 171d merge into pipe 171 at the downstream side of the first group of valves 303, and the pipe 171 communicates with the middle region of 143b of the shower head 140 (see FIG. 2 (b)). Pipes corresponding to the branch pipes 172a, 172b, 172c, and 172d merge into pipe 172 at the downstream side of the first group of valves 303, and the pipe 172 communicates with the edge region of 143c of the shower head 140 (see FIG. 2 (b)). Pipes corresponding to the branch pipes 173a, 173b, 173c, and 173d merge into pipe 173 at the downstream side of the first group of valves 303, and the pipe 173 communicates with the outer edge region of 143d of the shower head 140 (see FIG. 2 (b)).

With the above-described configuration, etching gases (including gas mixtures) may be selectively supplied to the regions 143a-143d of the shower head 140 by opening/closing the valves of the first group of valves 303, the second group of valves 302, and the third group of valves 300 accordingly. In the example illustrated in FIG. 3, pipes connected to the gas supply sources branch out to four pipes 170-173. Also, the pipes are connected to the first group of valves 303, and the etching gases to be supplied may be switched according to the desired process. Such a configuration may facilitate and simplify procedures for adding a new gas supply source or stopping the supply of an etching gas that is not required for a particular process, for example.

As described above, the plasma etching apparatus 100 of the present embodiment includes the device control unit 190 (see FIG. 1). The device control unit 190 includes a processing unit such as a CPU (not shown) and a recording medium such as a hard disk (not shown). The device control unit 190 controls operations of units including the first high frequency power source 114, the second high frequency power source 116, the temperature distribution adjustment unit 106, the upper electrode drive unit 200, and the gas supply condition adjustment unit 130, for example. To control the operations of the above units, the CPU of the device control unit 190 may implement corresponding programs stored in the hard disk of the device control unit 190 for prompting the units to execute an etching process, for example.

(Plasma Etching Method)

In the following, an exemplary plasma etching method using the above plasma etching apparatus 100 is described.

When etching gas is supplied from the gas spray holes h of the shower head 140 to a space between the shower head 140 and the susceptor 105, the etching gas is vacuumed up by the exhaust device 135 via the exhaust pipe 131 and spread toward the outer edge of the susceptor 105. The density distribution of etching gas components (e.g., radicals) may vary depending on whether transportation of the etching gas is dominated by the "flow" or "diffusion" of the etching gas. The Peclet number is a dimensionless number that qualitatively indicates the degree of dependency on the "diffusion" or the "flow". The Peclet number (Pe) may be expressed by Formula (1) indicated below:

$$Pe = uL/D_{AB} \qquad (1)$$

wherein
u: gas velocity (m/s);
$D_{AB}$: interdiffusion coefficient of gases; and
L: characteristic length (m).

When the Peclet number is less than one (1), gas is transported primarily by "diffusion". When the Peclet number is greater than one (1), gas is transported primarily by the "flow".

Note that the interdiffusion coefficient $D_{AB}$ for a gas mixture of gas A and gas B may be expressed by Formula (2) indicated below:

$$D_{AB} = 1.858 \times 10^{-3} T^{3/2} \frac{[[M_A + M_B]/M_A M_B]^{1/2}}{P \sigma_{AB}^2 \Omega_D}$$

wherein
$D_{AB}$: interdiffusion coefficient of second molecule within first molecule (cm$^2$/s);
$M_A$: molecular weight of first molecule;
$M_B$: molecular weight of second molecule;
T: absolute temperature (K);
$\Omega_D$: collision integral for diffusion;
P: pressure (atm);
$\sigma_{AB} = (\sigma_A + \sigma_B)/2$;
$\sigma_A$ = molecular diameter of first molecule; and
$\sigma_B$ = molecular diameter of second molecule.

For example, the interdiffusion coefficient $D_{AB}$ of etching gas containing Ar gas and $C_4F_8$ gas under a temperature of 150 (° C.) and a pressure of 80 mTorr; namely, 10.66 Pa (1.05×10$^{-4}$ atm) is $D_{AB}$=1.23×10$^{-1}$ m$^2$/s. The interdiffusion coefficient $D_{AB}$ of etching gas containing Ar gas and $CHF_3$ gas under a temperature of 150 (° C.) and a pressure of 30 mTorr (3.95×10$^{-5}$ atm) is $D_{AB}$=0.66 m$^2$/s.

Figure 4:
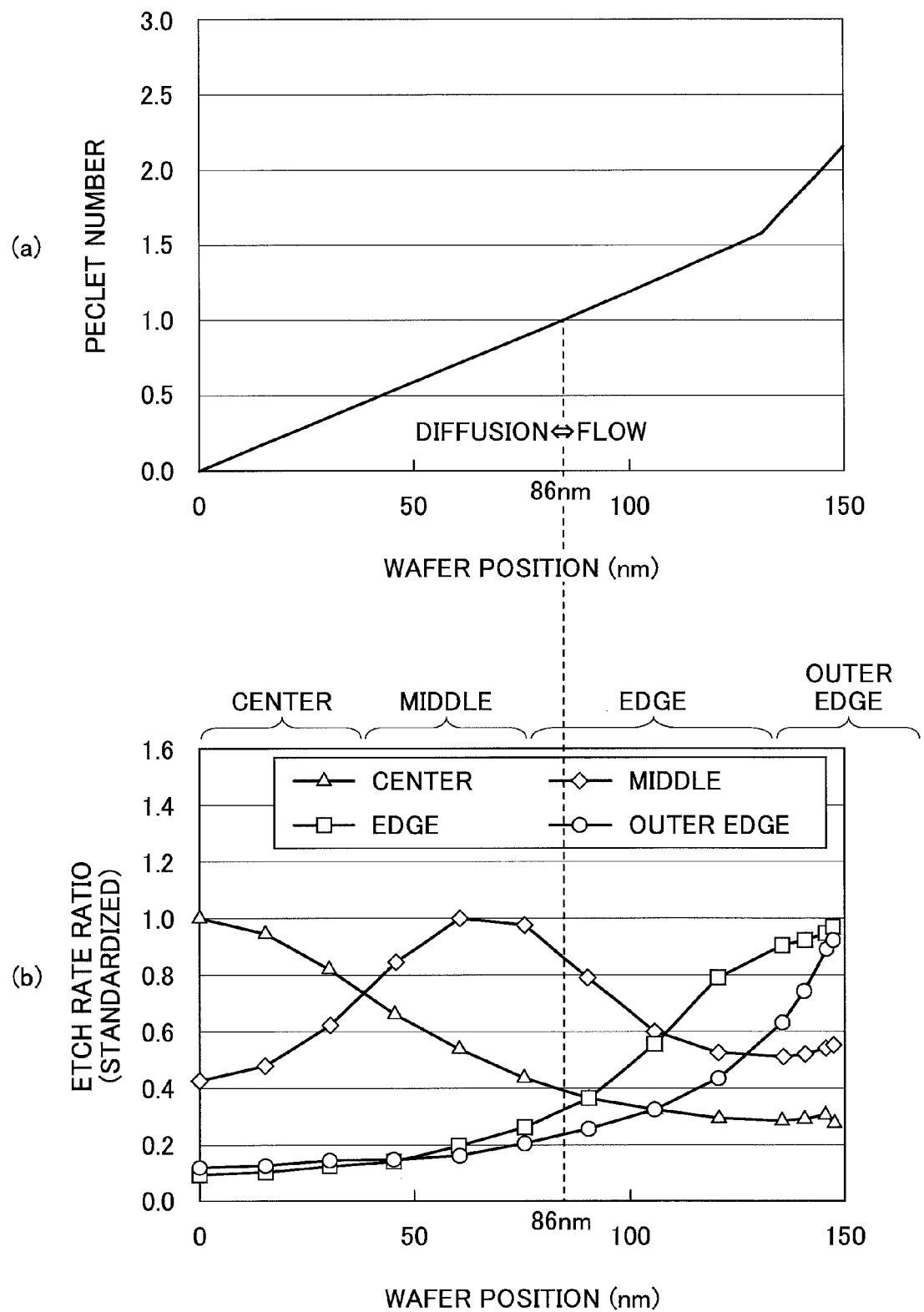
FIG. 4 illustrates the Peclet number and the etch rate at wafer positions in an exemplary case of implementing a plasma etching method according to an embodiment of the present invention.

To illustrate a specific example, FIG. 4 (a) indicates a change in the Peclet number along the radial direction of a wafer in the plasma etching apparatus 100. FIG. 4 (a) indicates the Peclet number obtained by calculating the velocity u in a case where a gas mixture of Ar gas and $C_4F_8$ gas (interdiffusion coefficient $D_{AB}$=1.23×10$^{-1}$ m$^2$/s) is used and the characteristic length L (i.e., gap G between the susceptor 105 and the upper electrode 120) is 30 mm. Note that in FIG. 4 (a), the horizontal axis represents radial positions of a 300-mm-diameter wafer with the center of the wafer corresponding to the origin (0 mm).

It can be appreciated from FIG. 4 (a) that the Peclet number is equal to one (1) at a radial position 86 mm from the center of the wafer, and at this position, the wafer is divided into a region where the effect of "diffusion" is greater than the effect of "flow" (region from 0 mm to 86 mm) and a region where the effect of "flow" is greater than the effect of "diffusion" (region from 86 mm to 150 mm). Note, however, that the border between the region where the effect of "diffusion" is greater than the effect of "flow" and the region where the effect of "flow" is greater than the effect of "diffusion" does not necessarily have to be exactly at the position where the Peclet number is equal to one (Pe=1). For example, a region where the Peclet number Pe is within a range of 0.7 to 1.3 may correspond to a transitional region.

FIG. 4 (b) indicates etch rate ratios along the radial direction of a wafer. Specifically, FIG. 4 (b) indicates measurements of etch rate ratios within a wafer plane obtained by supplying etching gas from the center region 143a, the middle region 143b, the edge region 143c, and the outer edge region 143d of the plasma etching apparatus 100 (see FIG. 2) and etching the wafer (300-mm-diameter bare wafer) by generating plasma using high frequency power. Note that the vertical axis of FIG. 4 (b) represents a standardized etch rate ratio with the etch rate of a maximum etch rate position set equal to one (1).

Referring to FIG. 4 (b), in a case where a gas mixture of etching gas and inert gas is supplied from the center region 143a and inert gas is supplied from the other regions (see graph with Δ mark), a high etch rate ratio is obtained at a wafer position below the center region 143a. Also, in a case where a gas mixture of etching gas and inert gas is supplied from the middle region 143b and inert gas is supplied from the other regions (see graph with ◇ mark), a high etch rate ratio is obtained at a wafer position below the middle region 143b.

Also, when the etching gas is supplied from the center region 143a, the wafer may be etched at a relatively high etch rate at the middle region 143b as well. Further, when the etching gas is supplied from the middle region 143b, the wafer may be etched at a relatively high etch rate at the edge region 143c, the outer edge region 143d, as well as the center region 143a. This may be because the effect of "diffusion" of the etching gas is greater than the effect "flow" of the etching gas at the center region 143a and the middle region 143b, the etching gas from the center region 143a or the middle region 143b are also diffused to the other regions (see FIG. 4 (a)).

On the other hand, in a case where a gas mixture of etching gas and inert gas is supplied from the edge region 143c and inert gas is supplied from the other regions (see graph with □ mark), although an increase in the etch rate can be seen at a wafer position below the outer edge region 143d at the outer side of the edge region 143c, substantially no increase in the etch rate can be seen at wafer positions below the center region 143a and the middle region 143b at the inner side of the edge region 143c. Similarly, in a case where a gas mixture of etching gas and inert gas is supplied from the very edge region 143d and inert gas is supplied from the other regions (see graph with ○ mark), substantially no increase in the etch rate can be seen at wafer positions below the center region 143a and the middle region 143b. This may be because etching gas from the edge region 143c and the very edge region 143d are primarily transported by the "flow" and are not diffused to the center region 143a and the middle region 143b (see FIG. 4 (a)).

FIG. 5 illustrates a change in the Peclet number and a change in the etch rate ratio in a case where a gas mixture of Ar gas and $CHF_3$ gas (interdiffusion coefficient $D_{AB}$=0.66 m$^2$/s) is used instead of the gas mixture of Ar gas and $C_4F_8$ gas. The interdiffusion coefficient $D_{AB}$ of the gas mixture of Ar gas and $CHF_3$ gas is less than the interdiffusion coefficient $D_{AB}$ of the gas mixture of Ar gas and $C_4F_8$ gas, and as illustrated in FIG. 5 (a), the Peclet number Pe in this case is less than 1 throughout the entire regions of the wafer. That is, in the case where the gas mixture of Ar gas and $CHF_3$ gas is used, gas transportation is dominated by "diffusion" throughout the entire regions of the wafer. Accordingly, as illustrated in FIG. 5 (b), even in the case where etching gas is supplied from the edge region 143c and the case where etching gas is supplied from the very edge region 143d, the etch rate may reach a maximum value at wafer positions below the edge region 143c and the very edge region 143d, respectively.

As can be appreciated from the above results, to improve in-plane uniformity of the etch rate by adjusting the supply conditions for supplying etching gas, a position subject to supply condition adjustment has to be switched depending on whether the etching gas supply position corresponds a position where the effect of diffusion of the etching gas is greater than the effect of flow or a position where the effect of flow of the etching gas is greater than the effect of diffusion. That is, with respect to the position where the effect of diffusion of etching gas is greater than the effect of flow, the etch rate may be controlled by adjusting the etching gas flow rate from gas spray holes h corresponding to (right above) this position, and with respect to the position where the effect of flow of etching gas is greater than the effect of diffusion, the etch rate may be controller by adjusting the etching gas flow rate from gas spray holes h located toward the center with respect to this position.

Also, as described above, the interdiffusion coefficient $D_{AB}$ may vary depending on the etching gas (gas mixture) used, and as a result, the region where the effect of diffusion of etching gas is greater than the effect of flow and the region where the effect of flow of etching gas is greater than the effect of diffusion may substantially vary even within the same chamber. This in turn suggests that in-plane uniformity of the etch rate within a wafer plane may vary depending on the etching object even when the same chamber is used, for example. Accordingly, it is important to assess the Peclet number and change gas supply conditions based on such assessment. Particularly, in the case where an etching object includes a region where the effect of diffusion of etching gas is greater than the effect of flow and a region where the effect of flow of the etching gas is greater than the effect of diffusion within the chamber, determining the manner of changing gas supply conditions may be important for achieving etch rate uniformity. In the plasma etching apparatus 100 according to the present embodiment, the buffer chamber 143 of the shower head 140 is divided into four regions 143a-143d by three annular partition wall members 145, and etching gas may be supplied from these regions at different flow rates. Accordingly, gas supply conditions may be adjusted as desired based on the assessment of the Peclet number as described above and in-plane uniformity of the etch rate within the wafer plane may be improved. Also, etching uniformity within a wafer plane may be improved by changing gas supply conditions for each etching gas to be used for each film to be etched, and thus, etching may be successively performed on a plurality of different etching films, for example.

Also, in consideration of the difficulties encountered in independently controlling the profile parameters of via holes and trenches, the inventors of the present invention have conducted numerous tests to determine etching conditions that enable independent control of such profile parameters, the findings of which are indicated below.

Plasma generated for etching an etching object includes ions (charged particles) and radicals (neutral particles). Ions may be accelerated by a bias voltage that is applied to the susceptor 105, for example, and in a case where a sufficiently wide gap G is secured between the upper electrode 120 and the susceptor 105, the plasma may be irradiated on the etching film of the wafer placed on the susceptor 105 in a direction perpendicular to the susceptor 105. On the other hand, the radicals are not accelerated by the bias voltage, but are diffused by a concentration gradient and adsorbed to the etching film. The etching may progress as reaction byproducts are separated from the surface of the etching film (including inner faces of via holes and trenches if such features are formed on the surface). In consideration of the above, the etch rate in the depth direction of the etching film ERv may be expressed by Formula (3) indicated below:

$$ERv = \frac{1}{n_C} \times \frac{1}{\frac{1}{\gamma \cdot \Gamma \text{ radical}} + \frac{1}{K_d + Yi \cdot \Gamma \text{ ion}}}$$

wherein
$n_c$: material density;
Γ radical: radical supply rate;
γ: adsorption coefficient by surface temperature;
$K_d$: thermal reaction rate;
Yi: sputtering yield; and
Γ ion: ion supply rate.

On the other hand, the etch rate in the planar direction of the etching film ERh may be expressed by Formula (4) indicated below:

$$ERh = \frac{1}{n_C} \times \frac{1}{\frac{1}{\gamma \cdot \Gamma \text{ radical}} + \frac{1}{K_d}}$$

wherein
$n_c$: material density;
Γ radical: radical supply rate;
γ: adsorption coefficient by surface temperature; and
$K_d$: thermal reaction rate.

Comparing Formula (3) and Formula (4), separation by ion bombardment affects the etch rate in the depth direction but not the etch rate in the planar direction; the etch rate in the planar direction merely depends on radical adsorption and separation by thermal energy. In other words, ions may contribute to etching in the depth direction while radicals may contribute to both etching in the depth direction and etching in the planar direction. Thus, in forming via holes and trenches (simply referred to as "vias" hereinafter) through plasma etching, controlling an amount etched from side wall faces of the vias by radicals may be important in terms of controlling the width of the vias. The amount etched by the radicals may be controlled by the supply rate of processing gas for generating the radicals and the mix ratio of the processing gas, for example.

On the other hand, in etching vias through plasma etching, reaction byproducts or polymers generated by decomposition of etching gas (simply referred to as "byproducts" hereinafter) may be adsorbed to the side walls of the vias to prevent adsorption of the radicals. The adsorption of byproducts to the side walls depends on the adsorption coefficient, and the adsorption coefficient depends on the temperature. Therefore, controlling the temperature of the wafer may be indispensable in controlling the width of via holes and trenches.

Figure 6:
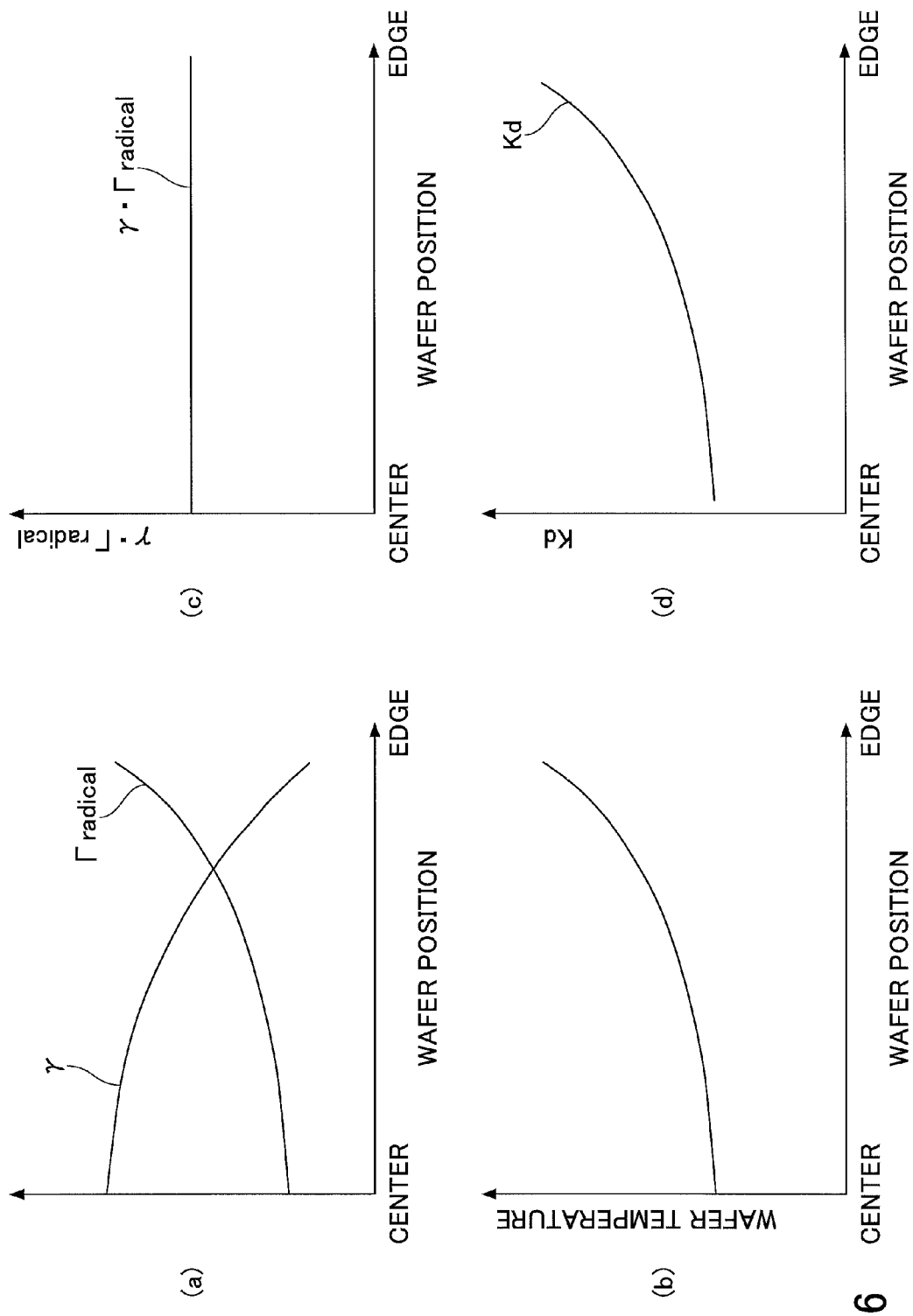
FIG. 6 illustrates a comparative example with respect to achieving uniformity in the etch rate.

For example, in a case where the radical supply rate Γ radical increases from the center portion toward the edge portion of the wafer surface as illustrated in FIG. 6 (a), the wafer temperature may be controlled to increase toward the wafer edge portion as illustrated in FIG. 6 (b), and by changing the adsorption coefficient γ as illustrated in FIG. 6 (a), the change in the Γ radical may be balanced out. In this way, uniformity of radical adsorption (γ·Γ radical) within the wafer plane may be achieved as illustrated in FIG. 6 (c). However, because the adsorption coefficient γ is changed, when the wafer temperature is adjusted as illustrated in FIG. 6 (*b*), uniformity of the thermal reaction rate $K_d$ may not be achieved within the wafer plane as illustrated in FIG. 6 (*d*). Accordingly, uniformity of the etching rate ERv and the etching rate ERh within the wafer plane may not be achieved.

Figure 7:
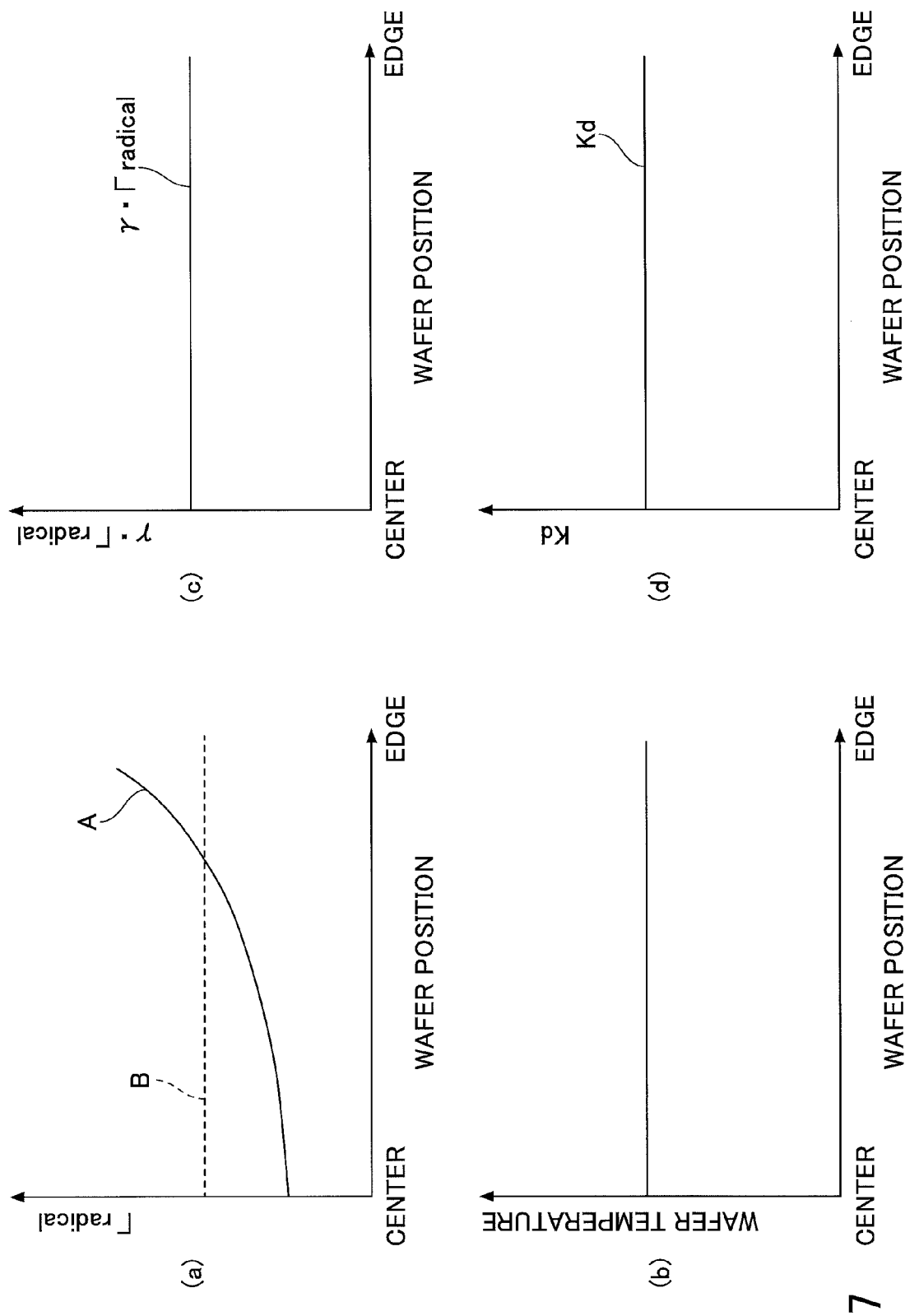
FIG. 7 illustrates how uniformity of the etch rate may be achieved according to an embodiment of the present invention.

In the plasma etching apparatus 100 described above, the buffer chamber 143 of the shower head 140 is divided into four regions 143*a*-143*d* by three annular partition wall members 145, and etching gas may be supplied from these regions 143*a*-143*d* at different flow rates. Thus, as illustrated by line A of FIG. 7 (*a*), for example, even when the radical supply rate Γ radical changes, uniformity of the radical supply rate Γ radical may be achieved as illustrated by line B of FIG. 7 (*a*) without changing the wafer temperature (see FIG. 7 (*b*)). As a result, uniformity of radical adsorption (γ·Γ radical) within the wafer plane may be achieved as illustrated in FIG. 7 (*c*). Moreover, because the wafer temperature may be maintained uniform, uniformity of the thermal reaction rate $K_d$ may be achieved within the wafer plane (see FIG. 7 (*d*)). That is, when achieving uniformity of radical adsorption within the wafer plane, other factors affecting the etch rate do not have to be changed. Accordingly, uniformity of the etch rate ERv and the etch rate ERh within the wafer plane may be achieved.

Also, in controlling the radical adsorption to be constant within the wafer plane by creating a wafer temperature distribution, in a case where different etching gases are used depending on the etching film, the wafer temperature has to be changed according to the etching gas used. That is, the wafer temperature has to be adjusted such that a different temperature distribution may be created in each etching film. Changing the wafer temperature to create such a temperature distribution for each etching film may be rather time consuming.

However, in the present embodiment, even when the etching film is changed, the in-plane wafer temperature may be changed in a uniform manner. Accordingly, operation for changing the wafer temperature may be simplified and achieving uniformity of the etch rate may be facilitated. Note that in creating a wafer temperature distribution within a wafer plane, it is generally difficult to maintain a predetermined temperature distribution, and deviations from the temperature distribution may have adverse effects on uniformity of the etch rate. On the other hand, achieving uniformity of the wafer temperature within a wafer plane is relatively easy compared to achieving a uniform temperature distribution.

Figure 8:
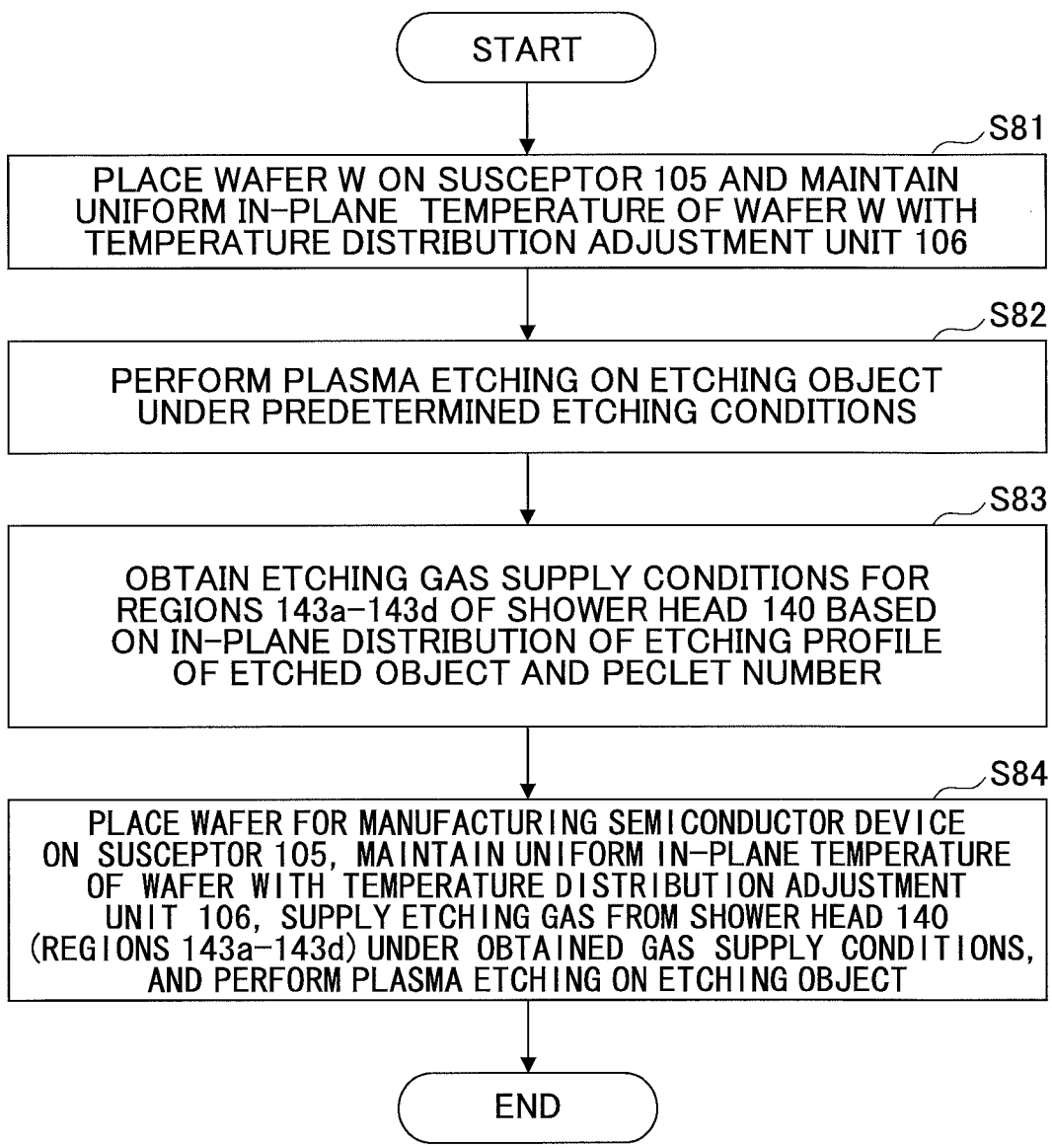
FIG. 8 is a flowchart illustrating a plasma etching method according to a first embodiment of the present invention.

Based on the above, as illustrated in FIG. 8, in a plasma etching method according to an embodiment of the present invention that is implemented using the plasma etching apparatus 100 described above, first, in step S81, the wafer W, as an etching object, is placed on the susceptor 105 and the in-plane temperature of the wafer W placed on the susceptor 105 is maintained uniform by the temperature distribution adjustment unit 106 (see FIG. 1), and in step S82, the etching object is etched under predetermined etching conditions. In step S83, the in-plane distribution of the etching profile obtained with respect to the etching object and the above Peclet number are taken into consideration in obtaining gas supply conditions for the regions 143*a*-143*d* of the shower head 140. Then, in step S84, plasma etching is performed on a wafer for manufacturing a semiconductor device under the obtained conditions. That is, the wafer is placed on the susceptor 105, the in-plane temperature of the wafer is maintained uniform by the temperature distribution adjustment unit 106, etching gas (gas mixture) is supplied from the shower head 140 (regions 143*a*-143*d*) under the obtained gas supply conditions, and plasma etching is performed on the etching object. In this way, uniformity of the etch rate within a wafer plane of the wafer W may be achieved.

Second Embodiment

In the following, a second embodiment of the present invention is described with reference to the accompanying drawings.

As described above, in plasma etching, a gas containing fluorine, chlorine, and oxygen, for example, may be used as an etching gas that is turned into plasma. Plasma includes active species such as charged particles (referred to as "ion" hereinafter) and neutral particles (referred to as "radicals" hereinafter), for example. The surface of a wafer reacts with the ions and radicals contained in the plasma to prompt the generation of reaction products, and etching of the wafer progresses as the reaction products are volatized.

In recent years, there is an increasing demand for forming holes with larger diameters in a semiconductor device manufacturing process, and as a result, it is becoming increasingly difficult to ensure in-plane etch rate uniformity. Techniques are known for improving in-plane uniformity within a wafer by controlling the density of active species within a center region and an edge region of a wafer plane through adjustment of the etching gas supply rate from an upper electrode (see e.g., Japanese Patent No. 4701776).

However, in the case of forming a trench/via structure through plasma etching for performing a Damascene process, for example, different etching gases may be used for forming a trench and forming a via. The inventors of the present invention have found that in the case where different etching gases are used as in the above example, achieving uniformity of both the trench profile and the via profile within a wafer plane is rather difficult.

In light of the above, an aspect of the present embodiment relates to a plasma etching method and a semiconductor device manufacturing method that can improve in-plane uniformity of trench and via profiles within a wafer plane.

(Plasma Etching Apparatus Configuration)

First, referring to FIG. 1, the plasma etching apparatus 100 suitable for implementing the plasma etching method according to the present embodiment is described.

As illustrated in FIG. 1, the plasma etching apparatus 100 includes the cylindrical chamber (processing chamber) 102 made of aluminum having an alumite-treated (anodized) surface, for example. The chamber 102 is grounded.

The substantially cylindrical susceptor support 104 is arranged at the bottom portion within the chamber 102 via the insulating plate 103 made of ceramic, for example. The susceptor 105 corresponding to a lower electrode is arranged on the susceptor support 104. The susceptor 105 is grounded via a high pass filter (HPF) 105*a*.

The susceptor 105 has an upper side center portion arranged into a convex circular plate shape. The electrostatic chuck 111 having substantially the same shape as a wafer W corresponding to a processing object (etching object) is arranged on this circular plate shaped portion. The electrostatic chuck 111 is made of an insulating material and has an electrostatic electrode 112 interposed between the insulating material. The electrostatic chuck 111 is a circular plate shaped ceramic member, and the electrostatic electrode 112 is connected to the DC power supply 113. For example, when a DC voltage of 1.5 kV is supplied from the DC power supply 113 to the electrostatic electrode 112, the wafer W may be electrostatically attracted to the electrostatic chuck 111 by a Coulomb force or a Johnsen-Rahbek force.

The first high frequency power supply 114 is connected to the susceptor 105 via the first matching unit 115, and the second high frequency power supply 116 is connected to the susceptor 105 via the second matching unit 117. The first high frequency power supply 114 supplies to the susceptor 105 a high frequency power for biasing having a relatively low frequency of 13.6 MHz, for example. The second high frequency power supply 116 supplies to the susceptor 105 a high frequency power for plasma generation having a relatively high frequency of 40 MHz, for example. In this way, the susceptor 105 can supply power for plasma generation within the chamber 102.

The gas passageway 118 for supplying a heat transfer medium (e.g., backside gas such as He gas) to the backside of the wafer W is arranged to extend through the insulating plate 103, the susceptor support 104, the susceptor 105, and the electrostatic chuck 111. Heat may be exchanged between the susceptor 105 and the wafer W via such a heat transfer medium so that the wafer W may be maintained at a predetermined temperature.

The annular focus ring 119 is arranged on an upper edge portion of the susceptor 105 to surround the wafer W that is placed on the electrostatic chuck 111. The focus ring 119 may be made of a dielectric material such as ceramic or quartz, or a conductive material such as a single crystal silicon. For example, the focus ring 119 may be made of the same conductive material as the wafer W.

By expanding a plasma distribution range to the focus ring 119, the plasma density at an edge portion of the wafer W may be maintained substantially the same as the plasma density at a center portion of the wafer W. In this way, plasma etching uniformity within a wafer plane may be improved.

The upper electrode 120, which also acts as the shower head 140 for supplying etching gas toward the wafer W held by the susceptor 105 (described below), is arranged above the susceptor 105 to be substantially parallel to the susceptor 105. The upper electrode 120 is connected to the DC power supply 123. The upper electrode 120 is grounded via the low pass filter (LPF) 124.

The upper electrode 120 may be driven by an upper electrode drive unit 200 to move in the vertical direction, for example. By arranging the upper electrode 120 to be movable in the vertical direction, a distance between the upper electrode 120 and the susceptor 105 (referred to as "gap G" hereinafter) may be adjusted. The gap G is a parameter that has a substantial influence on the diffusion and flow of etching gas. Accordingly, by enabling adjustment of the gap G, the plasma distribution at a space between the upper electrode 120 and the susceptor 105 within the chamber 102 may be controlled. Note that the displacement of the upper electrode 120 that is driven by the upper electrode drive unit 200 is not particularly limited. For example, the displacement of the upper electrode 120 may be 70 mm, and the gap G may be adjusted to be within a range of 20 mm to 90 mm.

Also, although the plasma etching apparatus 100 of the present embodiment has the wafer W placed on the susceptor 105 with its etching side facing upward and is configured to supply etching gas to the wafer W from the shower head 140 arranged above the susceptor 105, in other embodiments, a plasma etching apparatus may have a susceptor arranged to hold a wafer in a vertical direction and have a shower head arranged to supply etching gas to the wafer held by the susceptor from a lateral direction. In yet another embodiment, a plasma etching apparatus may have a susceptor arranged to hold a wafer such that its etching side faces downward, and a shower head arranged below the susceptor to supply etching gas to the wafer held facing downward by the susceptor.

The upper electrode 120 is supported by the upper inner wall of the chamber 102 via bellows 122. The bellows 122 are attached by fixing means such as bolts to the upper inner wall of the chamber 102 via the annular upper flange 122a. Also, the bellows 122 are attached by fixing means such as bolts to the surface of the upper electrode 120 via the annular upper flange 122b.

In the following, the upper electrode drive unit 200 for adjusting the gap G is described. The upper electrode drive unit 200 includes the substantially cylindrical support member 204 that supports the upper electrode 120. The support member 204 is attached to an upper center portion of the upper electrode 120 by fixing means such as a bolt.

The support member 204 is arranged to be movable in and out of a hole 102a formed around a center portion of an upper wall of the chamber 102. The outer peripheral face of the support member 204 is supported by the slide mechanism 210 inside the hole 102a of the chamber 102.

The slide mechanism 210 includes the fixing member 214 that is L-shaped in cross section, the guide member 216 that is fixed to a vertical portion of the fixing member 214 at an upper part of the chamber 102, and the rail part 212 arranged in one direction (vertical direction in the present example) on the outer peripheral face of the support member 204 to be slidably supported by the guide member 216.

The fixing member 214 that fixes the guide member 216 of the slide mechanism 210 is fixed to the upper part of the chamber 102 via a horizontal adjustment plate 218 having an annular horizontal portion. The horizontal positioning of the upper electrode 120 may be adjusted by the horizontal adjustment plate 218.

The horizontal adjustment plate 218 may be fixed to the chamber 102 by bolts that are arranged equidistantly around the horizontal adjustment plate 218, for example. A tilt of the horizontal adjustment plate 218 with respect to the horizontal direction may be adjusted by adjusting how much the bolts are protruding, for example. By adjusting the tilt of the horizontal adjustment plate 218 with respect to the horizontal direction and adjusting a tilt of the guide member 216 of the slide mechanism 210 with respect to the vertical direction, a tilt of the upper electrode 120 in the horizontal direction may be adjusted. That is, the upper electrode 120 may be constantly maintained horizontal.

The air pressure cylinder 220 for driving the upper electrode 120 is attached to the upper side of the chamber 102 via a cylindrical body 201. That is, the bottom edge of the cylindrical body 201 is hermetically sealed to the upper side of the chamber 102 by bolts, for example, to cover the hole 102a. The top edge of the cylindrical body 201 is hermetically sealed to the bottom edge of the air pressure cylinder 220.

The air pressure cylinder 220 includes the rod 202 that may be driven to move in one direction. The bottom end of the rod 202 may be connected to an upper center portion of the support member 204 by a bolt, for example. When the rod 202 is driven, the upper electrode 120 is driven by the support member 204 to move along the slide mechanism 210. The rod 202 may have a cylindrical structure, for example, and an internal space of the rod 202 communicates with a center hole formed at a center portion of the support 204 and is released to the atmosphere. In this way, wiring that is grounded via the upper electrode 120 and the low pass filter (LPF) 124, and a power supply line for supplying a DC voltage to the upper electrode 120 from the DC power supply 123 may be connected to the upper electrode 120 via the internal space of the rod 202 and the center hole of the support member 204.

Also, a position detector such as the linear encoder 205 for detecting the position of the upper electrode 120 is arranged at a side of the air pressure cylinder 220. The top end member 207 including an extending portion 207a extending sideways from the rod 202 is arranged at the top end of the rod 202. The extending portion 207a of the top end member 207 and the position detection unit 205a of the linear encoder 205 are arranged to be in contact with each other. The top end member 207 moves in conjunction with the upper electrode 120. Thus, the linear encoder 205 may detect the position of the upper electrode 120.

The air pressure cylinder 220 includes the cylinder main body 222, the upper support plate 224, and the lower support plate 226. The cylinder main body 222 is interposed between the upper support plate 224 and the lower support plate 226. The annular partition member 208 for partitioning the internal space of the air pressure cylinder 220 into the upper space 232 and the lower space 234 is arranged around an outer peripheral face of the rod 202.

Compressed air is introduced into the upper space 232 of the air pressure cylinder 220 from an upper port 236 of the upper support plate 224. Compressed air is introduced into the lower space 234 of the air pressure cylinder 220 from a lower port 238 of the lower support plate 226. By controlling the amount of air introduced into the upper space 232 and the lower space 234 from the upper port 236 and the lower port 238, the rod 202 may be driven and controlled to move in one direction (e.g., vertical direction). The amount of air introduced into the air pressure cylinder 220 is controlled by an air pressure circuit 300 arranged near the air pressure cylinder 220.

The upper electrode drive unit 200 also includes the control unit 290, which is connected to the device control unit 190. A control signal from the device control unit 190 is transmitted to the control unit 290, and in turn, the control unit 290 controls drive operations of various components of the upper electrode drive unit 200.

The temperature distribution adjustment unit 106 for adjusting an in-plane temperature distribution of the wafer W is arranged within the susceptor support 104. The temperature distribution adjustment unit 106 includes heaters 106a and 106b, heater power supplies 106c and 160d, thermometers 106e and 106f, and coolant paths 107a and 107b.

The susceptor support 104 has the heater 106a arranged at the center side and the heater 106b arranged at the outer side. The center side heater 106a is connected to the center side heater power supply 106c, and the outer side heater 106b is connected to the outer side heater power supply 106d. The center side heater power supply 106c and the outer side heater power supply 106d are capable of independently adjusting the power supplied to the center side heater 106a and the outer side heater 106b, respectively. In this way, a temperature distribution may be created at the susceptor support 104 and the susceptor 105 along the radial direction of the wafer W. That is, the temperature distribution along the radial direction of the wafer W may be adjusted.

Also, the susceptor support 104 has the thermometer 106e arranged at the center side and the thermometer 106f arranged at the outer side. The center side thermometer 106e and the outer side thermometer 106f measure temperatures of the susceptor support 104 at the center side and the outer side, respectively. In this way, the center side thermometer 106e and the outer side thermometer 106f may derive temperatures at the center side and the outer side of the wafer W. The temperatures measured by the center side thermometer 106e and the outer side thermometer 106f are transmitted to the device control unit 190. The device control unit 190 adjusts outputs of the center side heater power supply 106c and the outer side heater power supply 106d so that the temperatures of the wafer W derived from the measured temperatures reach their target temperatures.

The susceptor support 104 may also have the coolant path 107a arranged at the center side and the coolant path 107b arranged at the outer side. The center side coolant path 107a and the outer side coolant path 107b may be arranged to circulate coolants such as cooling water or fluorocarbon coolants at different temperatures, for example. To circulate the coolants, a coolant is introduced into the coolant path 107a via a center side introduction pipe 108a and is discharged via a center side discharge pipe 109a. Also, a coolant is introduced into the outer side coolant path 107b via an outer side introduction pipe 108b and is discharged via an outer side discharge pipe 109b.

The temperature of the susceptor 105 is adjusted through heating by the heaters 106a and 106b, and cooling by the coolants. Accordingly, the wafer W is adjusted to a predetermined temperature by heat from plasma radiation and irradiation of ions included in the plasma, and heat exchange with the susceptor 105. Note that because the susceptor support 104 has the center side heater 106a (and center side coolant path 107a) and the outer side heater 106b (and outer side coolant path 107b), the temperatures of the wafer W at the center side and the outer side may be independently adjusted.

Also, although not illustrated in FIG. 1, a heat insulating layer such as a heat insulating material or a space may be provided between the center side heater 106a and the outer side heater 106b or the center side coolant path 107a and the outer side coolant path 107b. By providing such a heat insulating layer, heat insulation may be achieved between the center side heater 106a and the outer side heater 106b or the center side coolant path 107a and the outer side coolant path 107b. That is, a greater heat distribution may be created between the center side and the outer side of the wafer W.

The exhaust pipe 131 is connected to the bottom portion of the chamber 102, and the exhaust device 135 is connected to the exhaust pipe 131. The exhaust device 135 includes a vacuum pump such as a turbo-molecular pump for adjusting the internal pressure within the chamber 102 to a reduced-pressure atmosphere (e.g., 0.67 Pa or lower). Also, a gate valve 132 is arranged at a side wall of the chamber 102. The gate valve 132 may be opened to allow the wafer W to be transferred into and out of the chamber 102. Note that a transfer arm may be used to transfer the wafer W, for example.

(Configuration of Adjustment Unit for Adjusting Etching Gas Supply Conditions)

In the following, the shower head 140 is described with reference to FIG. 2. As illustrated in FIG. 2, the shower head 140 includes the circular electrode plate 141 (upper electrode 120) having multiple gas spray holes h (ha-hd) and the electrode support 142 that detachably supports the upper side of the electrode plate 141. The electrode support 142 is arranged into a circular disk shape having the same diameter as the electrode plate 141. The circular buffer chamber 143 is formed within the electrode support 142.

As illustrated in FIG. 2 (a), the buffer chamber 143 has one or more annular partition wall members 145 forming O-rings arranged on the electrode plate 141. In the illustrated example, three annular partition wall members 145a, 145b, and 145c with differing diameters are concentrically arranged on the electrode plate 141. In this way, the buffer chamber 143 is divided into the center region 143a, the middle region 143b, the edge region 143c, and the outer edge region 143d along the radial direction of the electrode plate 141.

Also, as illustrated in FIG. 2 (b), the regions 143a-143d are each connected to the gas supply device 150, and in this way, etching gas may be supplied from the gas supply device 150 to each of the regions 143a-143d. The etching gas supplied to the regions 143a-143d is sprayed onto the wafer W held by the susceptor 105 via corresponding gas spray holes h.

Note that the number and layout of the spray holes h are preferably arranged such that etching gas may be evenly sprayed on the wafer W. Although not limited to the following, the gas spray holes h may be arranged along the circumferences of multiple concentric circles drawn concentrically around the center of the shower head 140 (electrode plate 141), for example. In one specific example, in a case where a wafer W with a diameter of 300 mm is used, the center region 143a may have four gas spray holes ha arranged (e.g., equidistantly) along the circumference of a 11-mm-radius circle, and twelve gas spray holes hb arranged (e.g., equidistantly) along the circumference of a 33-mm-radius circle. The middle region 143b may have twenty-four (24) gas spray holes hc arranged (e.g., equidistantly) along the circumference of a 55-mm-radius, and thirty-six (36) gas spray holes hd arranged (e.g., equidistantly) along the circumference of a 77-mm-radius circle. The edge region 143c may have forty-eight (48) gas spray holes (not shown) arranged (e.g., equidistantly) along the circumference of a 99-mm-radius circle, and sixty (60) gas spray holes (not shown) arranged (e.g., equidistantly) along the circumference of a 121-mm-radius circle. The outer edge region 143d may have eighty (80) gas spray holes (not shown) arranged (e.g., equidistantly) along the circumference of a 143-mm-radius circle, and one hundred (100) gas spray holes (not shown) arranged (e.g., equidistantly) along the circumference of a 165-mm-radius circle.

In the following, referring to FIG. 3, the gas supply device 150 and a gas supply system for individually supplying etching gas to the regions 143a-143d of the buffer chamber 143 are described. As illustrated in FIG. 3, the gas supply device 150 includes the first gas box 161 and the second gas box 160. The first gas box 161 accommodates the first group of valves 303 that are connected to a plurality of gas supply sources (not shown). The second gas box accommodates the second group of valves 302, the flow rate controllers 301 such as mass flow controllers for the individual valves of the second group of valves 302, and the third group of valves 303.

In the present embodiment, the gas supply sources include fluorocarbon-based fluorine compound (CF) gases such as $CF_4$ gas, $C_4F_6$ gas, $C_4F_8$ gas, $CH_2F_2$ gas, and $CHF_3$ gas, for example. Also, the gas supply sources include gas for controlling adhesion of reaction products of the CF gases such as oxygen ($O_2$) gas. Further, the gas supply sources include carrier gases such as Ar gas, $N_2$ gas, and He gas, for example.

Pipes extending from the gas supply sources are connected to corresponding valves of the first group of valves 303 within the first gas box 161. Also, in the present embodiment, a $CHF_3$ gas pipe and an $O_2$ gas pipe merge at the downstream side of the first group of valves 303, and the merged pipe then branches out into four branch pipes 170a, 171a, 172a, and 173a. By controlling the first group of valves 303, $CHF_3$ gas, $O_2$ gas, or a mixture thereof may flow into the branch pipes 170a-173a.

Similarly, a $CF_4$ gas pipe and a $N_2$ gas pipe merge at the downstream side of the first group of valves 303, and the merged pipe then branch out to four branch pipes 170b, 171b, 172b, and 173b. By controlling the first group of valves 303, $CF_4$ gas, $N_2$ gas, or a mixture thereof may flow into the branch pipes 170b-173b.

Similarly, an $O_2$ gas pipe and an Ar gas pipe merge at the downstream side of the first group of valves 303, and the merged pipe then branch out to four branch pipes 170c, 171c, 172c, and 173c. By controlling the first group of valves 303, $O_2$ gas, Ar gas, or a mixture thereof may flow into the branch pipes 170c-173c.

Similarly, a $C_4F_6$ gas pipe and a $C_4F_8$ gas pipe merge at the downstream side of the first group of valves 303, and the merged pipe then branch out to four branch pipes 170d, 171d, 172d, and 173d. By controlling the first group of valves 303, $C_4F_8$ gas, $C_4F_8$ gas, or a mixture thereof may flow into the branch pipes 170d-173d.

The branch pipes 170a-173a, 170b-1703b, 170c-173c, and 170d-173d are connected to corresponding valves of the second group of valves 302 and further connected to corresponding valves of the first group of valves 300 via flow rate controllers 301 within the second valve box 160.

Pipes corresponding to the branch pipes 170a, 170b, 170c, and 170d merge into pipe 170 at the downstream side of the first group of valves 303, and the pipe 170 communicates with the center region of 143a of the shower head 140 (see FIG. 2 (b)). Pipes corresponding to the branch pipes 171a, 171b, 171c, and 171d merge into pipe 171 at the downstream side of the first group of valves 303, and the pipe 171 communicates with the middle region of 143b of the shower head 140 (see FIG. 2 (b)). Pipes corresponding to the branch pipes 172a, 172b, 172c, and 172d merge into pipe 172 at the downstream side of the first group of valves 303, and the pipe 172 communicates with the edge region of 143c of the shower head 140 (see FIG. 2 (b)). Pipes corresponding to the branch pipes 173a, 173b, 173c, and 173d merge into pipe 173 at the downstream side of the first group of valves 303, and the pipe 173 communicates with the outer edge region of 143d of the shower head 140 (see FIG. 2 (b)).

With the above-described configuration, etching gases (including gas mixtures) may be selectively supplied to the regions 143a-143d of the shower head 140 by opening/closing the valves of the first group of valves 303, the second group of valves 302, and the third group of valves 300 accordingly. In the example illustrated in FIG. 3, pipes connected to the gas supply sources branch out to four pipes 170-173. Also, the pipes are connected to the first group of valves 303, and the etching gases to be supplied may be switched according to the desired process. Such a configuration may facilitate and simplify procedures for adding a new gas supply source or stopping the supply of an etching gas that is not required for a particular process, for example.

As described above, the plasma etching apparatus 100 of the present embodiment includes the device control unit 190 (see FIG. 1). The device control unit 190 includes a processing unit such as a CPU (not shown) and a recording medium such as a hard disk (not shown). The device control unit 190 controls operations of units including the first high frequency power source 114, the second high frequency power source 116, the temperature distribution adjustment unit 106, the upper electrode drive unit 200, and the gas supply condition adjustment unit 130, for example. To control the operations of the above units, the CPU of the device control unit 190 may implement corresponding programs stored in the hard disk of the device control unit 190 for prompting the units to execute an etching process, for example.

(Trench/Via Formation Method)

In the following, the semiconductor device manufacturing method including the plasma etching method of the present embodiment that is implemented using the plasma etching apparatus 100 is described with reference to FIGS. 9-12. Note that FIG. 10 (a) through FIG. 12 (f) illustrate top views of structures formed by processes of the semiconductor device manufacturing process described below (center), cross-sectional views of the top views along line A-A (left), and cross-sectional views of the top views along line B-B (right). Also, note that these drawings illustrate one exemplary trench/via structure of a plurality of trench/via structures formed on a wafer. Also, note that the processes illustrated by FIG. 10 (b) through FIG. 12 (f) may be successively performed by the plasma etching apparatus 100.

Figure 9:
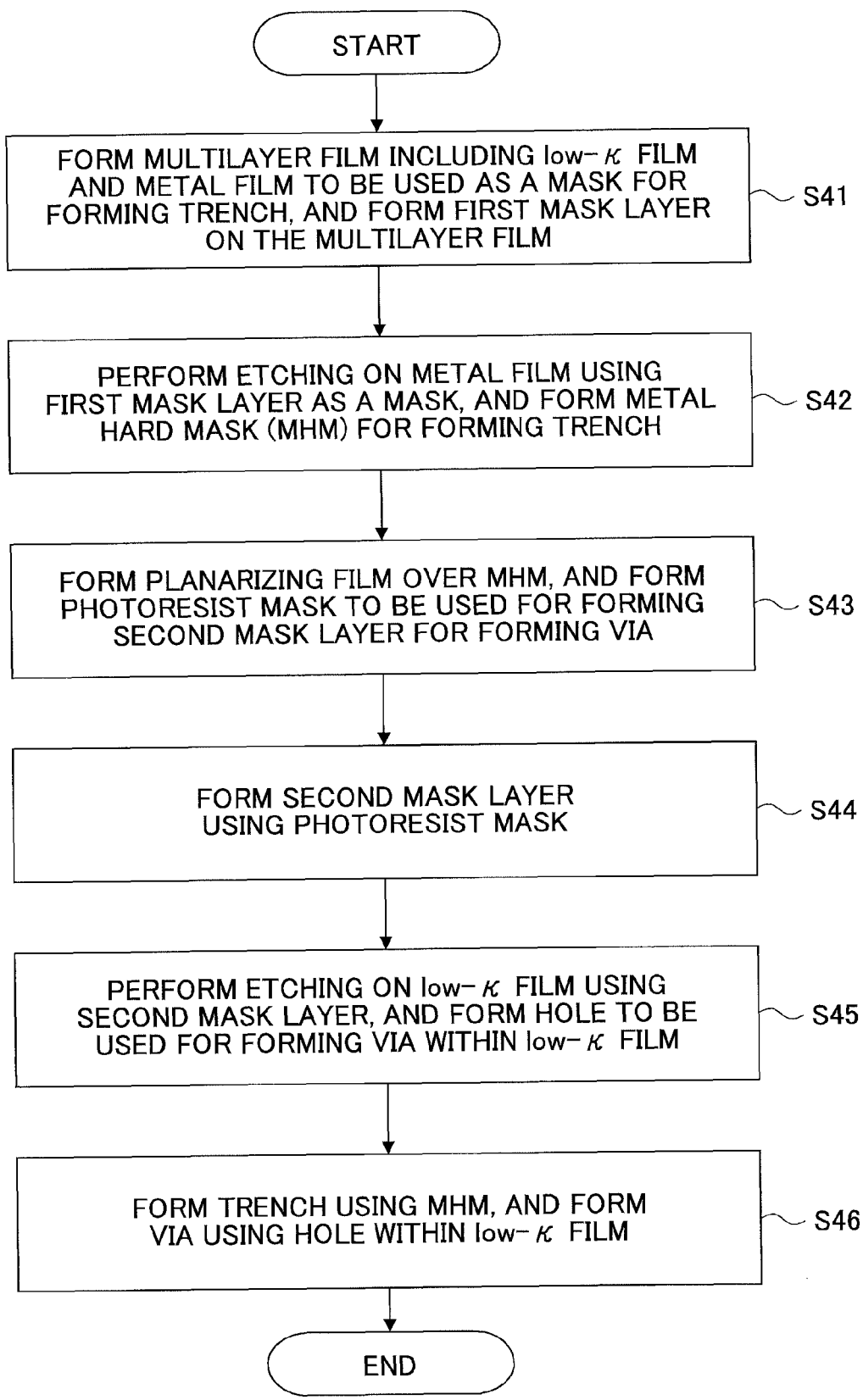
FIG. 9 is a flowchart illustrating a plasma etching method according to a second embodiment of the present invention.
Figure 10:
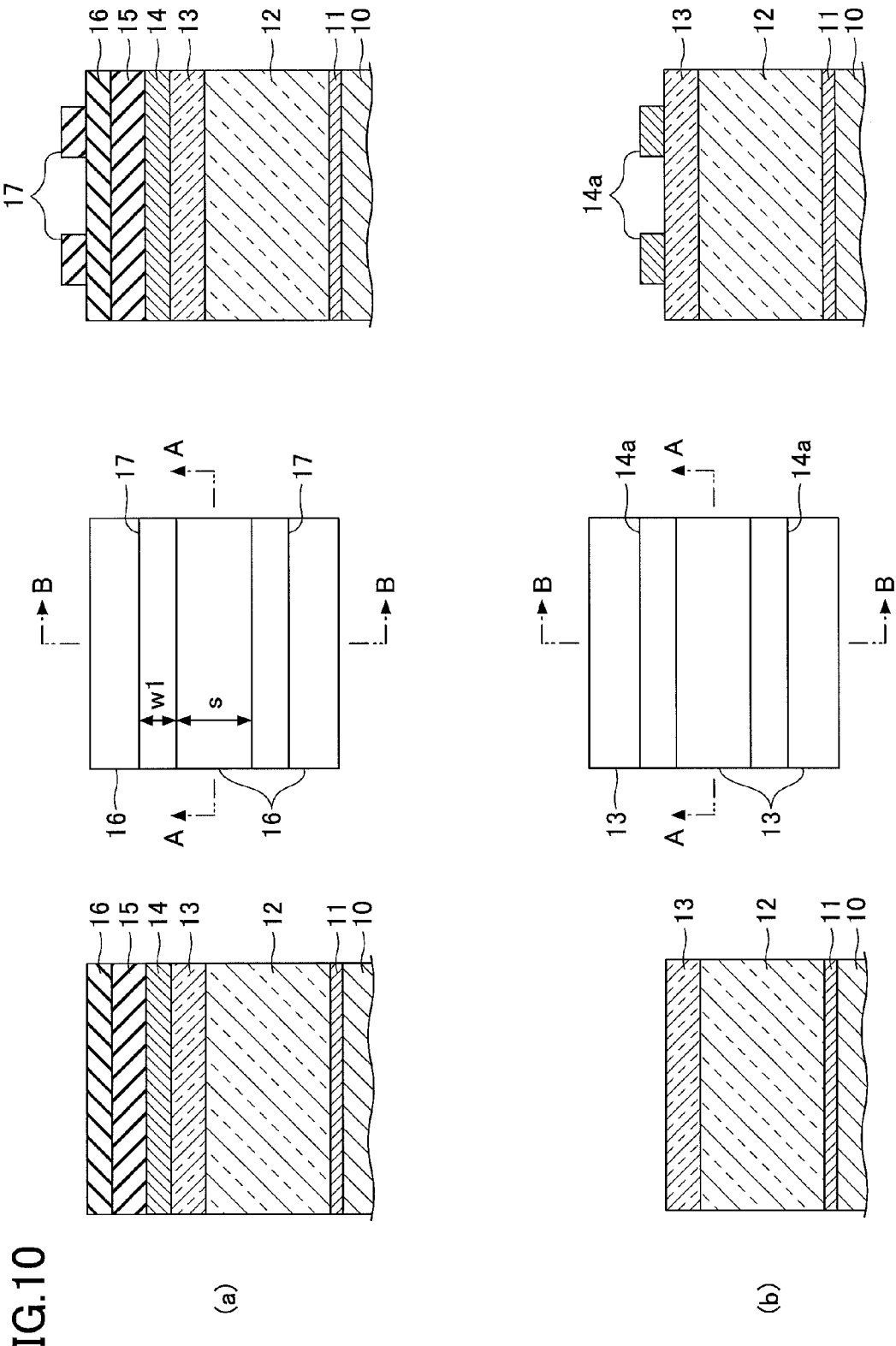
FIG. 10 illustrates top views (center) and cross-sectional views (left and right) of structures formed in processes of the plasma etching method of the second embodiment.

First, as illustrated in FIG. 10 (a), a block layer 11, a low dielectric (low-κ) layer 12, a silicon oxide layer 13, a titanium nitride (TiN) layer 14, an organic planarization layer 15, an anti-reflection film 16, and a first mask layer 17 are formed in this order on a wiring layer 10 that is formed on the wafer (step S41 of FIG. 9).

The block layer 11 may be formed by depositing a silicon oxide material on the wiring layer 10 using the plasma CVD (chemical vapor deposition) method, for example. An exemplary plasma etching method using the above plasma etching apparatus 100 is described. The block layer 11 is formed between the wiring layer 10 and the low-κ layer 12 to protect the wiring layer 10 from degradation by the low-κ layer 12.

The low-κ layer 12 may be made of a low dielectric material having a dielectric constant of about 3.5 or lower, for example. The low-κ layer 12 may be made of an impurity-doped silicon oxide-based material such as Black Diamond (registered trademark), SiOF, or SiOC, and a porous material, for example. The low-κ layer 12 may also be made of a spin-on material containing hydrogen silsesquioxane (HSQ) and methylsilsesquioxane (MSQ) as main components, for example. In the present embodiment, Black Diamond is used as the low-κ layer 12.

The silicon oxide layer 13 may be formed by the oxygen plasma CVD method using tetraethoxysilane (TEOS) as a raw material, for example. The organic planarization layer 15 is preferably formed by a spin-on material including an organic material as a main component. In this way, roughness of the under layer may be evened out by the fluidity of the spin-on material and the organic planarization layer 15 with a flat upper face may be formed.

The anti-reflection film 16 and a photoresist film (not shown) are successively formed on the upper face of the organic planarization layer 15, and the photoresist film is patterned by a photolithography process to form the first mask layer 17. In the example illustrated in FIG. 10 (a), the first mask layer 17 has line patterns extending in one direction. A width w1 of the line patterns may be 50 nm, and a spacing s between the line patterns may be 50 nm, for example. The pattern of the first mask film 17 may be determined based on the trench pattern (i.e., upper layer wiring to be formed later), which is described below.

Next, the wafer having the structure as illustrated in FIG. 10 (a) is introduced into the chamber 102 of the plasma etching apparatus 100. Then, the first mask layer 17 is used to remove the anti-reflection film 16 and the organic planarization layer 15. The removal process may be performed by exposing the wafer to oxygen plasma, for example. Then, etching is performed on the TiN layer 14 using a gas containing corrosion components such as bromine and chlorine. In this way, the pattern of the first mask layer 17 may be transferred to the TiN layer 14. Then, the first mask layer 17 used for etching the TiN layer 14 and the anti-reflection film 16 and the organic planarization layer 15 remaining below the first mask layer 17 are removed using oxygen plasma, for example, to form a metal hard mask (MHM) 14a (step S42 of FIG. 9).

Next, an organic planarization layer 25 is formed to cover the MHM 14a and the silicon oxide layer 13 located below the MHM 14a. The organic planarization layer 25 may be made of the same material and formed in the same manner as the organic planarization layer 15, for example. Then, an anti-reflection film 26 and a photoresist film are formed on the organic planarization layer 25, and a photoresist mask 27 is formed by patterning the photoresist film (step S43 of FIG. 9). As illustrated in FIG. 11 (c), the upper face of the photoresist mask 27 has a substantially circular-shaped opening 27h, and the diameter w2 of the opening 27h is arranged to be smaller than the spacing s of the pattern of the first mask layer 17 (i.e., spacing of the MHM 14a). The opening 27h is formed at a position of a via that establishes electrical connection with the wiring layer 10, and the diameter w2 of the opening 27h corresponds to the dimension (size) of the via.

Next, the photoresist mask 27 is used to etch the anti-reflection film 26 and the organic planarization layer 25, and as illustrated in FIG. 11 (d), a second mask layer 25a is formed from the organic planarization layer 25 (step S44 of FIG. 9). The second mask layer 25a includes an opening 25h having the same dimension as that of the opening 27h of the photoresist mask 27.

Figure 12:
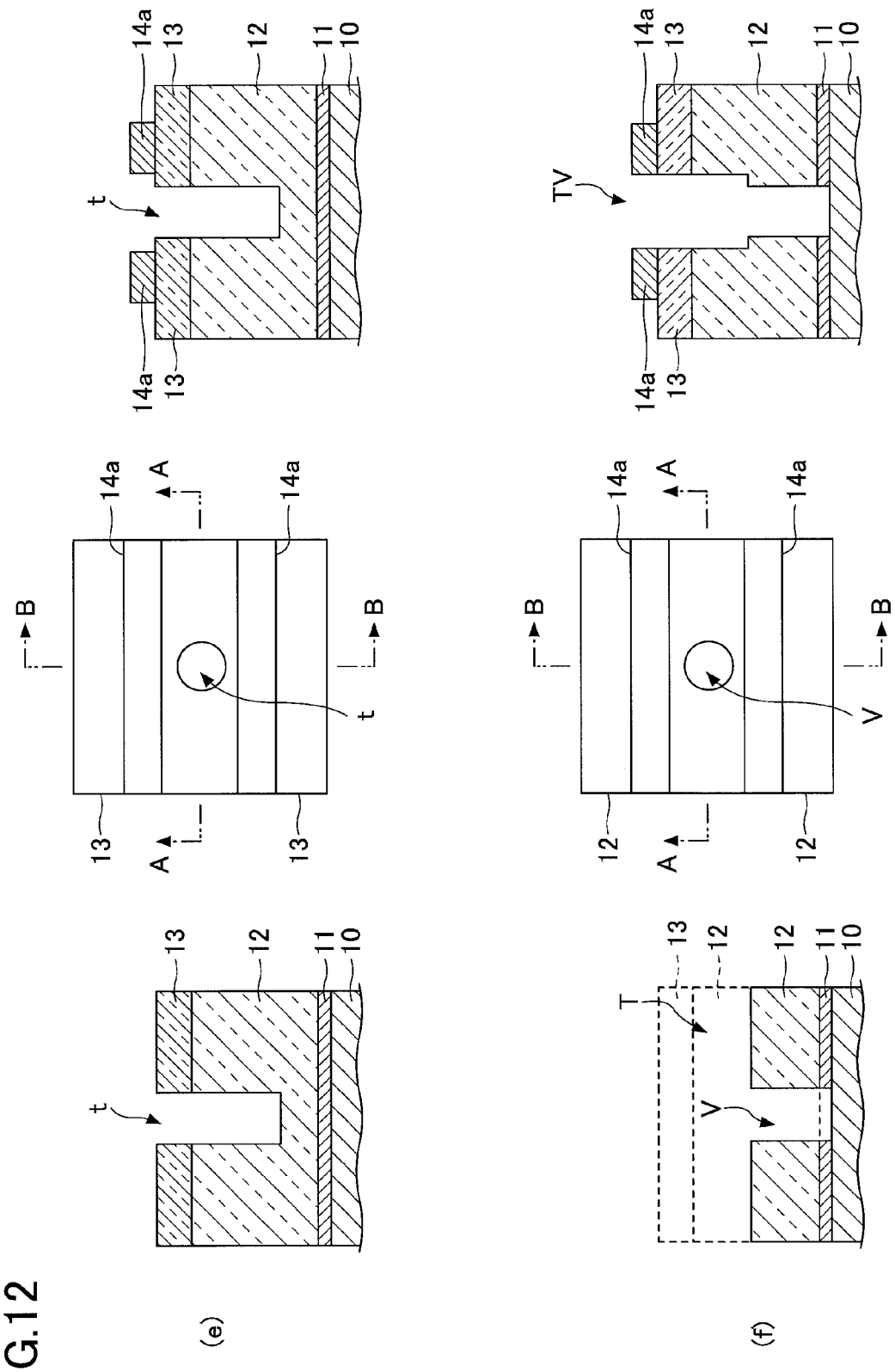
FIG. 12 illustrates top views (center) and cross-sectional views (left and right) of structures formed in processes of the plasma etching method of the second embodiment (continued from FIG. 11)

Next, the second mask layer 25a is used to perform plasma etching on the silicon oxide layer 13 and the low-κ layer 12 using a $CHF_3/Ar/N_2$ gas mixture, and the second mask layer 25a used in the plasma etching process is then removed to obtain a structure (via profile) as illustrated in FIG. 12 (e) (step S45 of FIG. 9). As illustrated, in this structure, a hole t penetrating through the silicon oxide layer 13 and having a depth that is less than the total thickness of the silicon oxide layer 13 and the low-κ layer 12 is formed. The depth of the hole t is determined by the etching time.

Next, the MHM 14a is used as a mask to perform plasma etching on the silicon oxide layer 13 and the low-κ layer 12 using a $C_4F_8/Ar/N_2/O_2$ gas mixture to obtain a structure (trench profile) as illustrated in FIG. 12 (f) (step S46 of FIG. 9). That is, a trench T that penetrates through the silicon oxide layer 13 and reaches a predetermined depth position within in the low-κ layer 12 is formed by prompting plasma etching of portions of the silicon oxide layer 13 not covered by the MHM 14a (see FIG. 12 (e)). Also, the bottom portion of the hole t illustrated in FIG. 12 (e) is etched by the plasma etching process such that a via V with a bottom face corresponding to the upper face of the wiring layer 10 is formed. In this way, a trench/via structure TV is formed as illustrated in FIG. 12 (f). In the illustrated example, the trench T has a width s (spacing s of the first mask layer 17) and is arranged to extend in a direction perpendicular to the width direction. The via V is arranged into a substantially cylindrical opening extending to a predetermined position from the bottom of the trench T. Note that plasma etching conditions for the processes of FIG. 12 (e) and FIG. 12 (f) are described below.

Next, the via V and the trench T may be filled with metal by a Damascene process (metal inlaying and CMP (chemical-mechanical planarization)), and in this way, a via plug electrically connected to the wiring layer 10 and a metal wiring integrally connected to the via may be formed.

(Plasma Etching Method)

In the following, an exemplary plasma etching method that may be implemented by the plasma etching apparatus 100 is described.

Note that in the plasma etching method described below, a substrate including a first wiring layer (wiring layer 10) on which an insulating layer and a metal layer are successively formed, a metal mask layer (MHM 14a) having a first opening for defining a trench for a second wiring layer, and a second mask layer having a second opening 27h that is smaller than the first opening for defining a via for interconnecting the first wiring layer and the second wiring layer is prepared. The first opening is formed by etching the metal layer formed on the first wiring layer, and the second opening is formed by etching a planarization layer arranged on the insulating layer and covering the metal mask layer. The substrate is then introduced into the plasma etching apparatus 100 after which etching is performed using the second mask layer and etching is further performed using the metal mask layer to form a desired trench/via structure. Note that the second mask layer and the metal mask layer are described above (see Trench/Via Structure Formation Method).

When etching gas is supplied from the gas spray holes h of the shower head 140 to a space between the shower head 140 and the susceptor 105, the etching gas is vacuumed up by the exhaust device 135 via the exhaust pipe 131 and spread toward the outer edge of the susceptor 105. The density distribution of etching gas components (e.g., radicals) may vary depending on whether transportation of the etching gas is dominated by the "flow" or "diffusion" of the etching gas. The Peclet number is a dimensionless number that qualitatively indicates the degree of dependency on the "diffusion" or "flow". The Peclet number (Pe) may be expressed by Formula (1) indicated below:

$$Pe = uL/D_{AB} \qquad (1)$$

wherein
 u: gas velocity (m/s);
 $D_{AB}$: interdiffusion coefficient of gases; and
 L: characteristic length (m).

When the Peclet number is less than one (1), gas is transported primarily by "diffusion". When the Peclet number is greater than one (1), gas is transported primarily by the "flow".

Note that the interdiffusion coefficient $D_{AB}$ for a gas mixture of gas A and gas B may be expressed by Formula (2) indicated above.

For example, the interdiffusion coefficient $D_{AB}$ of etching gas containing Ar gas and $C_4F_8$ gas under a temperature of 150 (° C.) and a pressure of 80 mTorr ($1.05 \times 10^{-4}$ atm) is $D_{AB} = 1.23 \times 10^{-1}$ m$^2$/s. The interdiffusion coefficient $D_{AB}$ of etching gas containing Ar gas and $CHF_3$ gas under a temperature of 150 (° C.) and a pressure of 30 mTorr ($3.95 \times 10^{-5}$ atm) is $D_{AB} = 0.66$ m$^2$/s.

Figure 13:
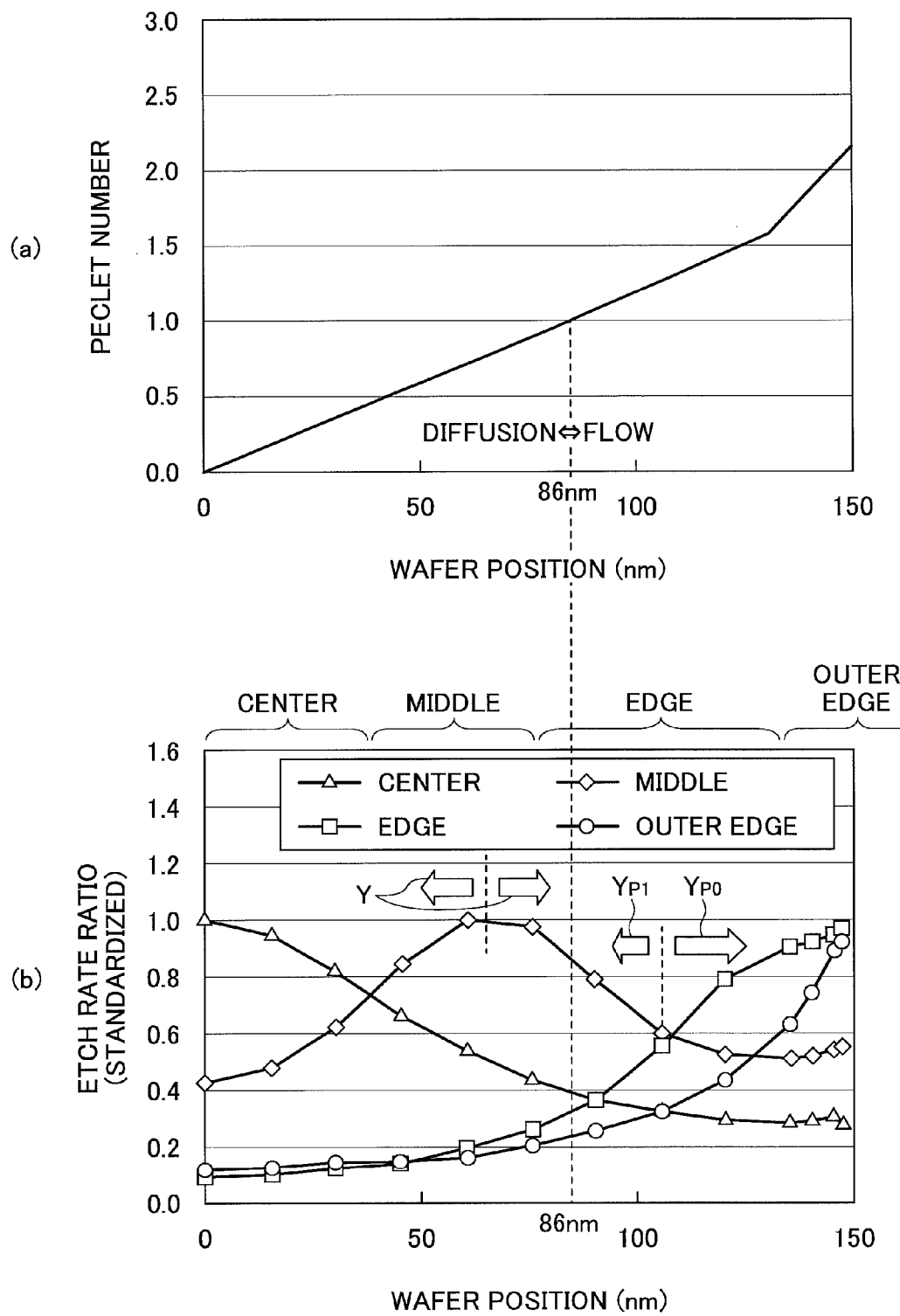
FIG. 13 illustrates the Peclet number and the etch rate at wafer positions in an exemplary case of implementing a plasma etching method according to an embodiment of the present invention.

To illustrate a specific example, FIG. 13 (*a*) indicates a change in the Peclet number along the radial direction of a wafer in the plasma etching apparatus 100. FIG. 13 (*a*) indicates the Peclet number obtained by calculating the velocity u in a case where a gas mixture of Ar gas and $C_4F_8$ gas (interdiffusion coefficient $D_{AB} = 1.23 \times 10^{-1}$ m$^2$/s) is used and the characteristic length L (i.e., gap G between the susceptor 105 and the upper electrode 120) is 30 mm. Note that in FIG. 13 (*a*), the horizontal axis represents radial positions of a 300-mm-diameter wafer with the center of the wafer corresponding to the origin (0 mm).

It can be appreciated from FIG. 13 (*a*) that the Peclet number is equal to one (1) at a radial position 86 mm from the center of the wafer, and at this position, the wafer is divided into a region where the effect of "diffusion" is greater than the effect of "flow" (region from 0 mm to 86 mm) and a region where the effect of "flow" is greater than the effect of "diffusion" (region from 86 mm to 150 mm). Note, however, that the border between the region where the effect of "diffusion" is greater than the effect of "flow" and the region where the effect of "flow" is greater than the effect of "diffusion" does not necessarily have to be exactly at the position where the Peclet number is equal to one (Pe=1). For example, a region where the Peclet number Pe is within a range of 0.7 to 1.3 may correspond to a transitional region.

FIG. 13 (*b*) indicates etch rate ratios along the radial direction of a wafer. Specifically, FIG. 13 (*b*) indicates measurements of etch rate ratios within a wafer plane obtained by supplying etching gas from the center region 143*a*, the middle region 143*b*, the edge region 143*c*, and the outer edge region 143*d* of the plasma etching apparatus 100 (see FIG. 2) and etching the wafer (300-mm-diameter bare wafer) by generating plasma using high frequency power. Note that the vertical axis of FIG. 13 (*b*) represents a standardized etch rate ratio with the etch rate of a maximum etch rate position set equal to one (1).

Referring to FIG. 13 (*b*), in a case where a gas mixture of etching gas and inert gas is supplied from the center region 143*a* and inert gas is supplied from the other regions (see graph with Δ mark), a high etch rate ratio is obtained at a wafer position below the center region 143*a*. Also, in a case where a gas mixture of etching gas and inert gas is supplied from the middle region 143*b* and inert gas is supplied from the other regions (see graph with ◇ mark), a high etch rate ratio is obtained at a wafer position below the middle region 143*b*.

Also, when the etching gas is supplied from the center region 143*a*, the wafer may be etched at a relatively high etch rate at the middle region 143*b* as well. Further, when the etching gas is supplied from the middle region 143*b*, the wafer may be etched at a relatively high etch rate at the edge region 143*c*, the outer edge region 143*d*, as well as the center region 143*a*. This may be because the effect of "diffusion" of the etching gas is greater than the effect "flow" of the etching gas at the center region 143*a* and the middle region 143*b*, the etching gas from the center region 143*a* or the middle region 143*b* are also diffused to the other regions (see FIG. 13 (*a*)).

On the other hand, in a case where a gas mixture of etching gas and inert gas is supplied from the edge region 143*c* and inert gas is supplied from the other regions (see graph with □ mark), although an increase in the etch rate can be seen at a wafer position below the outer edge region 143*d* at the outer side of the edge region 143*c*, substantially no increase in the etch rate can be seen at wafer positions below the center region 143*a* and the middle region 143*b* at the inner side of the edge region 143*c*. Similarly, in a case where a gas mixture of etching gas and inert gas is supplied from the very edge region 143*d* and inert gas is supplied from the other regions (see graph with ○ mark), substantially no increase in the etch rate can be seen at wafer positions below the center region 143*a* and the middle region 143*b*. This may be because etching gas from the edge region 143*c* and the very edge region 143*d* are primarily transported by the "flow" and are not diffused to the center region 143*a* and the middle region 143*b* (see FIG. 13 (*a*)). Note that in FIG. 13 (*b*), a small arrow $Y_{P1}$ indicates that substantially no etching gas is diffused toward the center region 143*a* and the middle region 143 and a large arrow $Y_{P0}$ indicates that the etching gas is transported outward.

FIG. 14 illustrates a change in the Peclet number and a change in the etch rate ratio in a case where a gas mixture of Ar gas and $CHF_3$ gas (interdiffusion coefficient $D_{AB} = 0.66$ m$^2$/s) is used instead of the gas mixture of Ar gas and $C_4F_8$ gas. The interdiffusion coefficient $D_{AB}$ of the gas mixture of Ar gas and $CHF_3$ gas is less than the interdiffusion coefficient $D_{AB}$ of the gas mixture of Ar gas and $C_4F_8$ gas, and as illustrated in FIG. 14 (*a*), the Peclet number Pe in this case is less than 1 throughout the entire regions of the wafer. That is, in the case where the gas mixture of Ar gas and $CHF_3$ gas is used, gas transportation is dominated by "diffusion" throughout the entire regions of the wafer. Accordingly, as illustrated in FIG. 14 (*b*), even in the case where etching gas is supplied from the edge region 143*c* and the case where etching gas is supplied from the very edge region 143*d*, the etch rate may reach the maximum at wafer positions below the edge region 143c and the very edge region 143d, respectively (see arrows Y in FIG. 14 (*b*)).

As can be appreciated from the above results, to improve in-plane uniformity of the etch rate by adjusting the supply conditions for supplying etching gas, a position subject to supply condition adjustment has to be switched depending on whether the etching gas supply position corresponds to a position where the effect of diffusion of the etching gas is greater than the effect of flow or a position where the effect of flow of the etching gas is greater than the effect of diffusion. That is, with respect to the position where the effect of diffusion of etching gas is greater than the effect of flow, the etch rate may be controlled by adjusting the etching gas flow rate from gas spray holes h corresponding to (right above) this position, and with respect to the position where the effect of flow of etching gas is greater than the effect of diffusion, the etch rate may be controller by adjusting the etching gas flow rate from gas spray holes h located toward the center with respect to this position.

Also, as described above, the interdiffusion coefficient $D_{AB}$ may vary depending on the etching gas (gas mixture) used, and as a result, the region where the effect of diffusion of etching gas is greater than the effect of flow and the region where the effect of flow of the etching gas is greater than the effect of diffusion may substantially vary even within the same chamber. This in turn suggests that in-plane uniformity of the etch rate within a wafer plane may vary depending on the etching film even when the same chamber is used, for example. Accordingly, it is important to assess the Peclet number and change gas supply conditions based on such assessment. Particularly, in the case where an etching object includes a region where the effect of diffusion of etching gas is greater than the effect of flow and a region where the effect of flow of the etching gas is greater than the effect of diffusion within the chamber, determining the manner of changing gas supply conditions may be important for achieving etch rate uniformity. In the plasma etching apparatus 100 according to the present embodiment, the buffer chamber 143 of the shower head 140 is divided into four regions 143a-143d by three annular partition wall members 145, and etching gas may be supplied from these regions at different flow rates. Accordingly, gas supply conditions may be adjusted as desired based on the assessment of the Peclet number as described above and in-plane uniformity of the etch rate within the wafer plane may be improved, for example. Also, etching uniformity within a wafer plane may be improved by changing gas supply conditions for each etching gas to be used for each film to be etched, and thus, etching may be successively performed on a plurality of different etching films, for example.

In the following, the effects of gas supply conditions on gas transportation are described. That is, supply gas parameters that contribute to improving the in-plane uniformity of profiles within a wafer plane are described.

Diffusion of supply gas depends on the mean free path l (m) of diffusion molecules (gas molecules) and the gas flow rate u (m/s). Assuming the supply gas is in an ideal gas state and the Maxwell distribution applies to the molecular speed of the diffusion molecules, the mean free path l of the diffusion molecules may be expressed by Formula (5) indicated below:

$$l = (T \times C_1)/(d^2 \times P) \quad (5)$$

wherein $C_1$: constant;
d: molecular collision diameter of gas molecules (m);
P: pressure in the system (atm); and
T: temperature in the system (K).

Also, assuming the supply gas is in an ideal gas state, the supply gas flow rate u may be expressed by Formula (6) indicated below.

$$u = (Q \times C_2)/PV \quad (6)$$

wherein $C_2$: constant;
Q: flow rate at 1 atmosphere (m³/s);
P: pressure in the system (atm); and
V: volume in the system (m³).

In this case, because a supply gas diffusion area $d_{area}$ is proportionate to the ratio of the mean free path l to the flow rate u (l/u), Formula (7) indicated below may be derived from Formula (5) and Formula (6).

$$d_{area} \propto l/u = (T \times V \times C_3)/(d^2 Q) \quad (7)$$

wherein $C_3$: constant.

It can be appreciated from the above that the supply gas diffusion area depends on the volume in the system, the supply gas flow rate, the temperature in the system, and the molecular collision diameter. Note that the volume in the system approximates the volume of the space between the upper electrode 120 and the susceptor 105 in the present embodiment, and because the diameter of a processing object does not change during plasma etching, the distance of the space between the upper electrode 120 and the susceptor 105 (gap G) may be used to represent this parameter. Also, the supply gas flow rate has a correlation with the pressure in the system. Further, because the molecular collision diameter depends on the type of supply gas (i.e., molecular weight of the supply gas), the supply gas diffusion area may also depend on the molecular weight of the supply gas.

In the following, referring to FIG. 15, experiments are described that indicate how the supply gas diffusion area depends on parameters (supply conditions) such as the supply gas flow rate (and supply gas pressure), the supply gas molecular weight, and the gap G.

Figure 15:
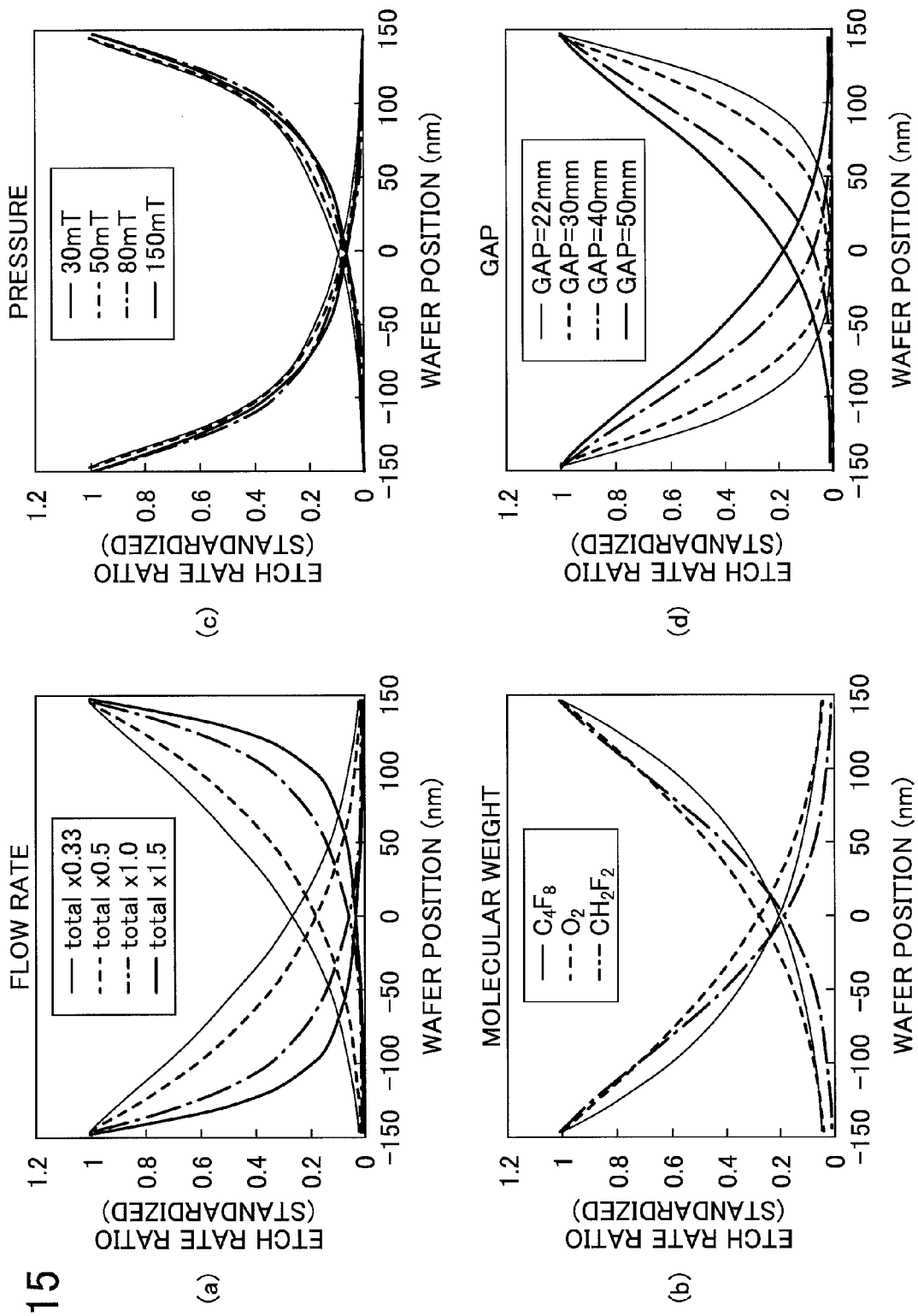
FIG. 15 illustrates changes in the etch rate in cases where etching gas supply conditions are changed in a plasma etching method according to an embodiment of the present invention.

FIG. 15 illustrates changes in the etch rate when processing gas supply conditions are changed in the present embodiment. Note that the graphs in FIG. 15 represent measurements obtained in a case where the supply rates of gas mixtures supplied to the center region 143a, the middle region 143b, the edge region 143c, and the very edge region 143d were adjusted such that the gas pressures of etching gases supplied from the gas spray holes ha-hd at the regions 143a-143d would be constant (see description of etching gas supply conditions below). The total flow rate of etching gas in this case is indicated below. Note, however, that an additional 20 sccm of $C_4F_8$ gas was supplied from gas spray holes arranged at the outer edge region 143d. The vertical axes of the graphs of FIG. 15 represent the etch rate of silicon oxide having a hard mask formed thereon, the etch rate being standardized by setting the positions of the maximum etch rate (outermost position) to 1.

Detailed etching conditions are indicated below.

| | |
|---|---|
| Pressure within chamber 102 | 80 mTorr |
| | (Pressure change range: 30-150 mTorr) |
| Gap G | 30 mm |
| | (Gap change range: 22-50 mm) |
| High frequency power supply power (40 MHz/13 MHz) | 700/1000 W |
| Upper electrode potential | 0 V |
| Etching gas total flow rate | $C_4F_8$/Ar/$N_2$/$O_2$ = 30/1200/70/17 sccm |
| Processing time | 60 seconds |

Note that $C_4F_8$ ($O_2$ or $CH_2F_2$ upon molecular weight change) at 20 sccm was added to the gas mixture supplied from the outer edge region 143d, and when changing the flow rates, changes were made within a range of 0.33-1.5 times the above flow rates.

It can be appreciated from the measurement results of FIG. 15 how each parameter affects the diffusion of supply gas. For example, by decreasing the supply gas flow rate, decreasing the supply gas molecular weight, and increasing the gap G, the supply gas may be diffused to a greater extent. In other words, by controlling these parameters, the concentration distribution of gas (i.e., radicals) may be controlled, and in this way, in-plane uniformity of profiles within a wafer plane may be improved upon performing plasma etching. On the other hand, as can be appreciated from Formula (7), the pressure within the chamber 102 is not a parameter for the diffusion area of supply gas. Thus, as illustrated in FIG. 15 (c), no substantial change in the diffusion area can be seen even when the pressure within the chamber 102 is changed.

EXPERIMENTAL RESULTS

In the following, experiments conducted for the purpose of confirming the effects of the plasma etching apparatus and plasma etching method of the present embodiment and their results are described with reference to FIGS. 16 and 17.

Experiment 1

First, a wafer (300-mm-diameter wafer) having a low-κ film, a silicon oxide film, and a TiN film formed thereon in this order was prepared. These films were formed according to the method described above with reference to FIG. 10 (a). Then, a photolithography process and an etching process were performed to arrange the TiN film into a line pattern and form a metal hard mask (MHM). Then, the silicon oxide film exposed at an opening of the MHM and the low-κ film beneath the silicon oxide film were etched by a $C_4F_8/Ar/N_2/O_2$ gas mixture. This etching process corresponds to the process described above with reference to FIG. 12 (f) (step S46 of FIG. 9) in that it involves etching the silicon oxide film and the low-κ film using a TiN mask. More specifically, this etching process corresponds to the step of forming the trench T illustrated in FIG. 12 (f). Accordingly, for the purpose of illustration, the opening formed at the silicon oxide film and the low-κ film in the above etching process is referred to as "trench" hereinafter.

Also, the following two sets of gas mixture supply conditions were used to etch the trenches.

<Condition 1-1>

| Center region 143a | $C_4F_8/Ar/N_2/O_2$ = 1.3/53/3.1/1.0 sccm |
|---|---|
| Middle region 143b | $C_4F_8/Ar/N_2/O_2$ = 4.9/198/12/3.8 sccm |
| Edge region 143c | $C_4F_8/Ar/N_2/O_2$ = 8.9/356/21/6.8 sccm |
| Outer edge region 143d | $C_4F_8/Ar/N_2/O_2$ = 14.8/593/35/11 sccm |

<Condition 1-2>

| Center region 143a | $C_4F_8/Ar/N_2/O_2$ = 1.3/53/3.1/1.0 sccm |
|---|---|
| Middle region 143b | $C_4F_8/Ar/N_2/O_2$ = 4.9/198/12/3.8 sccm |
| Edge region 143c | $C_4F_8/Ar/N_2/O_2$ = 13.4/356/21/6.8 sccm |
| Outer edge region 143d | $C_4F_8/Ar/N_2/O_2$ = 0/593/35/11 sccm |

Also, other conditions commonly implemented under both condition 1-1 and condition 1-2 are indicated below.
<Common Conditions>

| Pressure within chamber 102 | 80 mTorr |
|---|---|
| Gap G | 30 mm |
| High frequency power supply power (40 MHz/13 MHz) | 400/200 W |
| Upper electrode potential | 700 V |
| Processing time | 95 seconds |

Figure 16:
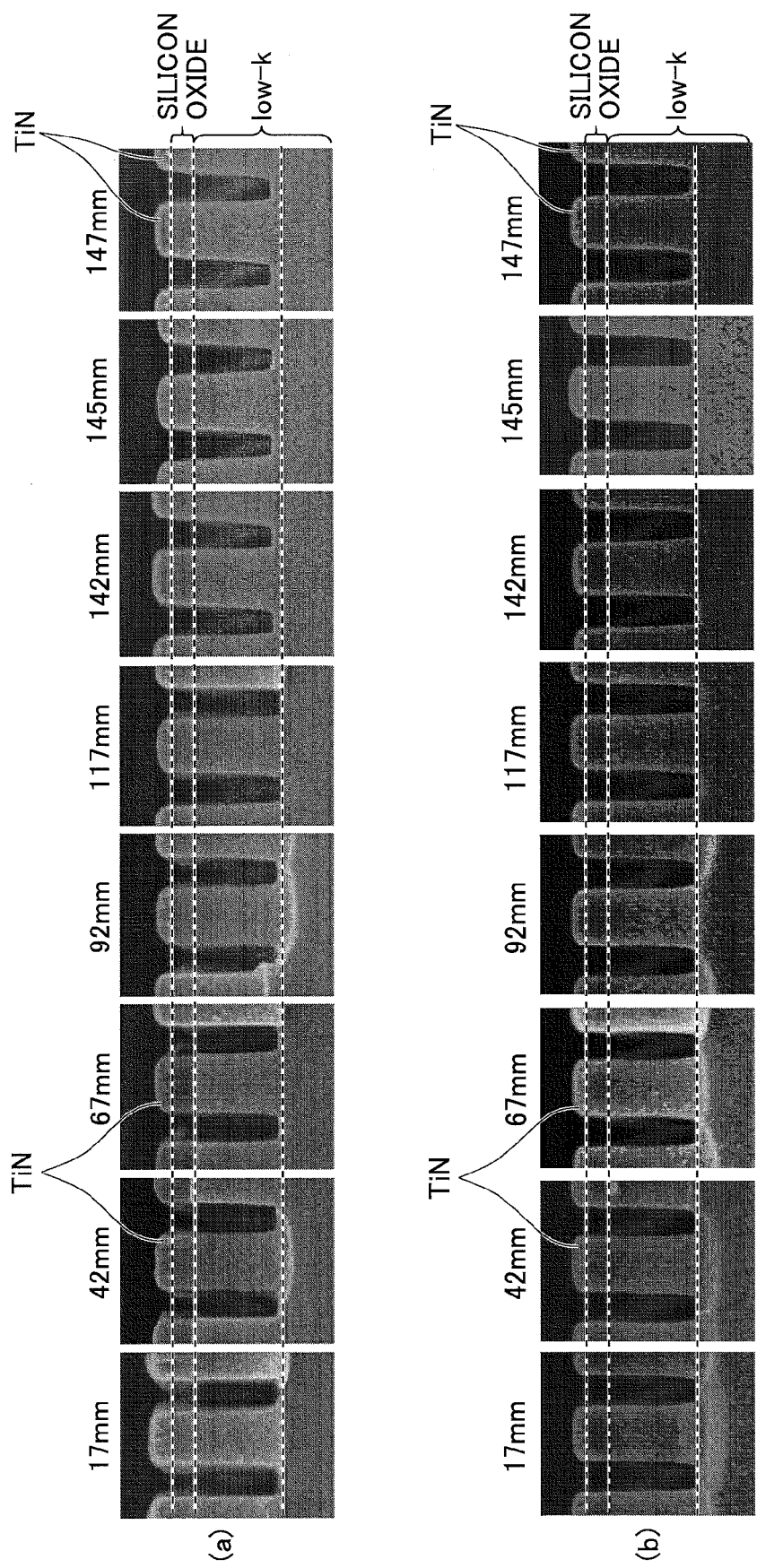
FIG. 16 illustrates scanning electron microscope (SEM) images of experimental results.
Figure 17:
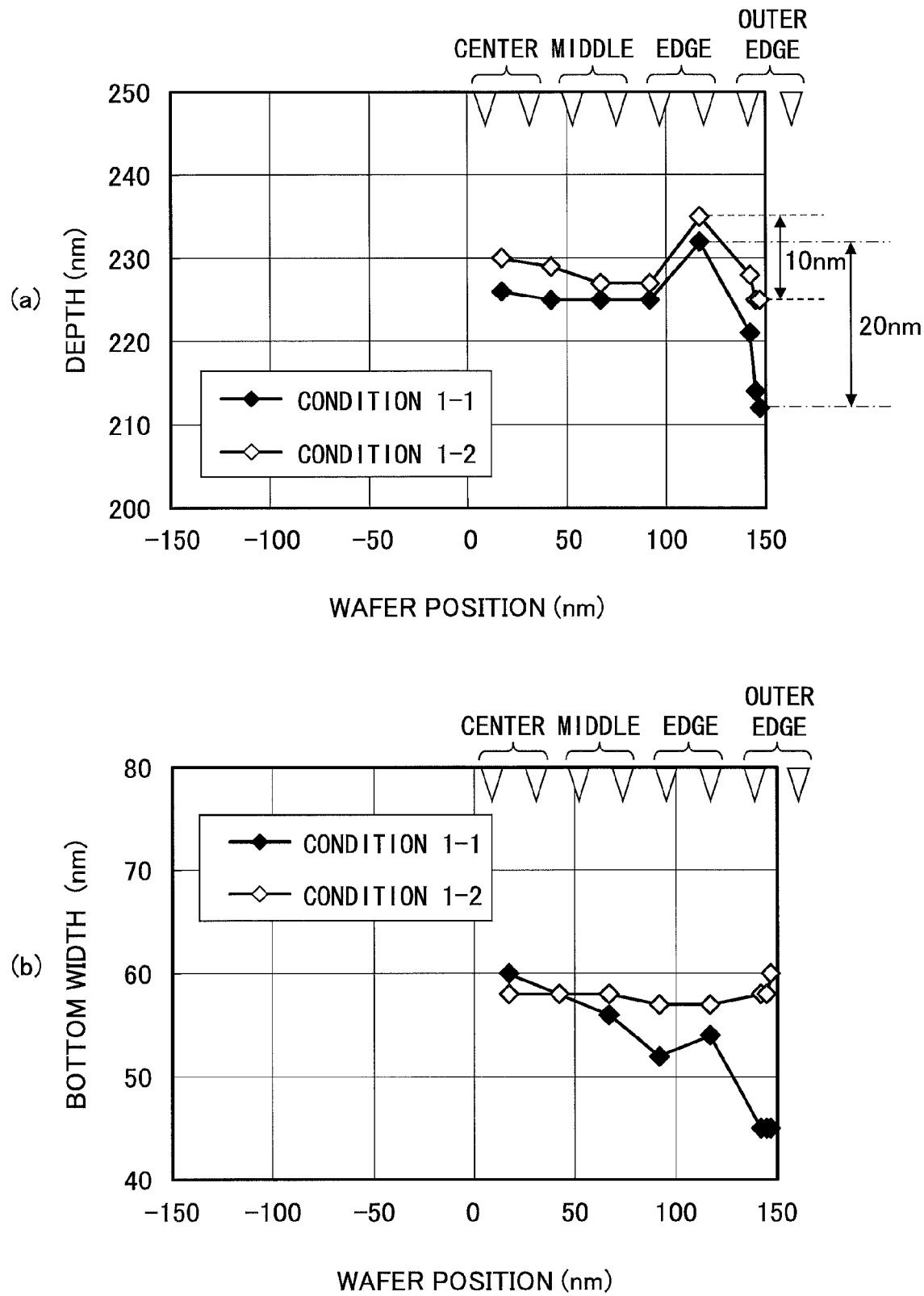
FIG. 17 illustrates graphs indicating the experimental results.

FIG. 16 illustrates the results of Experiment 1. FIG. 16 (a) is a scanning electron microscope (SEM) image of a cross-section of a trench formed by performing plasma etching under the above condition 1-1, and FIG. 16 (b) is a scanning electron microscope (SEM) image of a cross-section of a trench formed by performing plasma etching under the above condition 1-2. Note that the numeric values indicated above the SEM images of FIG. 16 represent positions of the wafer from its center.

It can be perceived from FIG. 16 (a) that the depth of the trenches gets shallower towards the outer edge of the wafer compared to the wafer center. Also, at the center side of the wafer, the cross-sectional shapes of the trenches are substantially rectangular; however, at the outer edge side of the wafer, the inner walls of the trenches are tapered and the bottom portions of the trenches are smaller than the top portions. On the other hand, in FIG. 16 (b), no substantial variation can be seen in the depths of the trenches formed at the wafer center side and the wafer edge side, and no substantial variation can be seen in the cross-sectional shapes of the trenches formed at the wafer center side and the wafer edge side. These experimental results are represented by graphs in FIG. 17. Referring to FIG. 17 (a), with respect to the depth of the trenches, the difference between the maximum value and the minimum value of the depth may be approximately 20 nm under condition 1-1, but the difference may be reduced to approximately 10 nm under condition 1-2. Also, as illustrated in FIG. 17 (b), the difference between the maximum value and the minimum value of the bottom width of the trenches may be approximately 15 nm under condition 1-1, but the difference may be reduced to approximately 2 nm under condition 1-2. That is, in-plane uniformity of the etching profile within the wafer plane may be improved by switching etching conditions from condition 1-1 to condition 1-2.

Next, etching was performed under different etching conditions from the above conditions, and in-plane uniformity of the cross-sectional shapes of trenches within the wafer plane was examined. Specifically, etching was performed under condition 2-1 and condition 2-2 indicated below (and the above common conditions).
<Condition 2-1>

| Center region 143a | $C_4F_8/Ar/N_2/O_2$ = 1.3/53/3.1/1.0 sccm |
|---|---|
| Middle region 143b | $C_4F_8/Ar/N_2/O_2$ = 4.9/198/12/3.8 sccm |
| Edge region 143c | $C_4F_8/Ar/N_2/O_2$ = 8.9/356/21/6.8 sccm |

-continued

| Outer edge region 143d | $C_4F_8/Ar/N_2/O_2 = 0/593/35/11$ sccm |
|---|---|

<Condition 2-2>

| Center region 143a | $C_4F_8/Ar/N_2/O_2 = 1.3/53/3.1/1.0$ sccm |
|---|---|
| Middle region 143b | $C_4F_8/Ar/N_2/O_2 = 4.9/198/12/3.8$ sccm |
| Edge region 143c | $C_4F_8/Ar/N_2/O_2 = 13.4/356/21/6.8$ sccm |
| Outer edge region 143d | $C_4F_8/Ar/N_2/O_2 = 0/593/35/11$ sccm |

Figure 18:
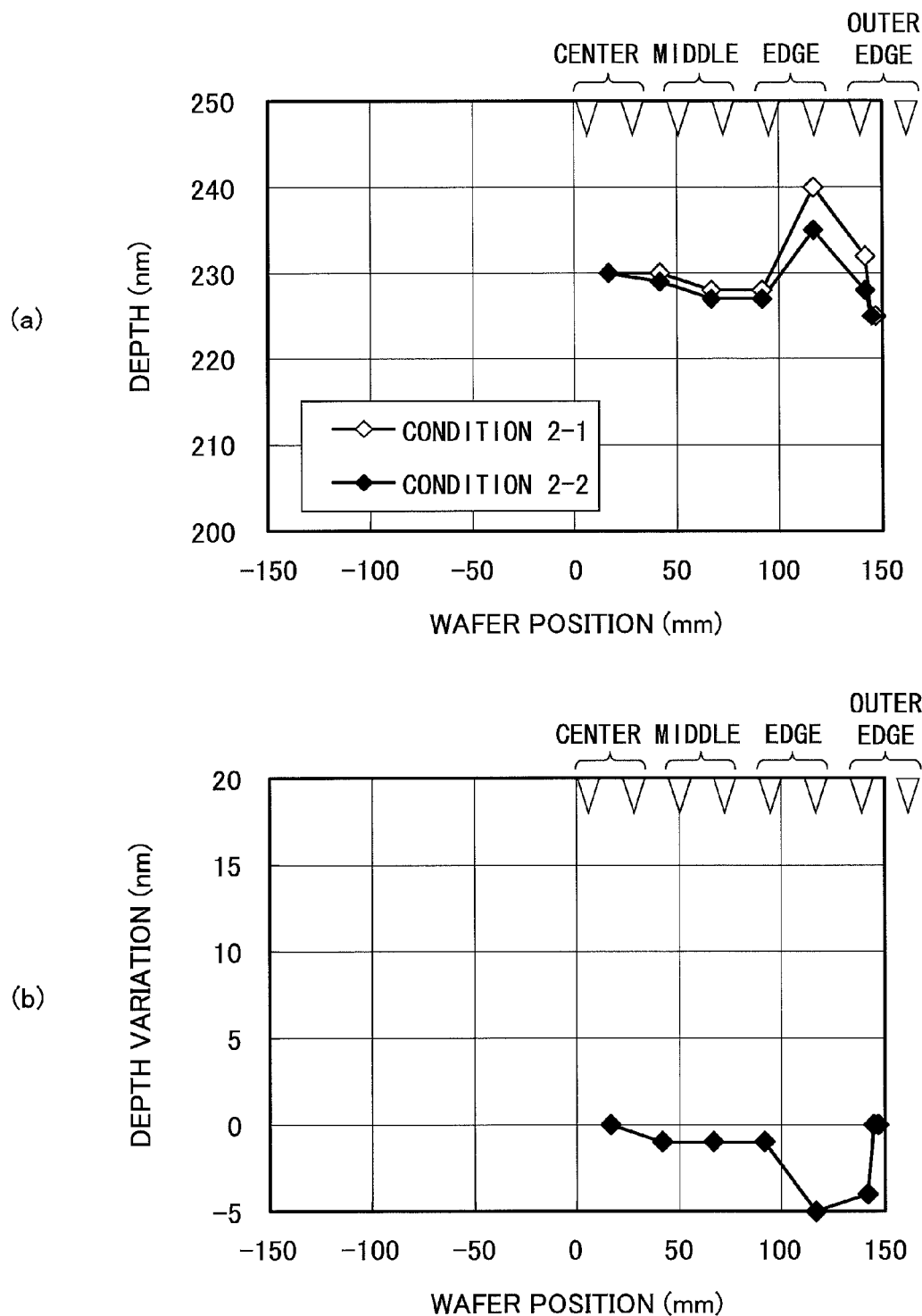
FIG. 18 illustrates graphs indicating other experimental results.

FIG. 18 illustrates the in-plane uniformity of the cross-sectional shapes of trenches formed under condition 2-1 and condition 2-2. Referring to FIG. 18 (a), under condition 2-1, trenches get deeper at wafer positions below the outer portion of the edge region 143c and below the outer edge region 143d (see graph with ◇ mark). On the other hand, the trench depth at the relevant region is shallower in the case where condition 2-2 is used; that is, improvement in the uniformity of the trench depth within the wafer plane can be seen when condition 2-2 is used (see graph with ◆ mark). FIG. 18 (b) illustrates differences in the trench depth between the case where condition 2-1 is used and the case where condition 2-2 is used. As can be appreciated from FIG. 18 (b), by switching the gas supply condition from condition 2-1 to condition 2-2, the trench depth at the relevant region may be approximately 5 nm shallower. Moreover, no substantial change in the trench depth can be seen at the wafer positions below the center region 143a and the middle region 143b even when the gas supply condition is switched from condition 2-1 to condition 2-2. This may be attributed to the fact that by increasing the supply rate of $C_4F_8$ gas supplied from the edge region 143c under condition 2-2, because the effect of "flow" of the supply gas is greater than the effect of "diffusion" of supply gas at the edge region 143, the $C_4F_8$ gas may be spread outward from the edge region 143c by the effect of "flow" and the etch rate may be accelerated, but the $C_4F_8$ gas may not be easily diffused inward from the edge region 143c. Thus, no substantial change in the etch rate may occur at the center region 143a and the middle region 143b whether condition 2-1 or condition 2-2 is used.

Experiment 2

In Experiment 2, first, a wafer (300-mm-diameter wafer) having a low-κ film and a silicon oxide film formed thereon in this order was prepared. Then, a photoresist mask was formed by a photolithography process, and the silicon oxide film exposed from an opening of the photoresist mask and the low-κ film beneath the silicon oxide film were etched using a $CHF_3/Ar/N_2$ gas mixture. Note that in this etching process corresponds to the process described above with reference to FIG. 12 (e) (step S45 of FIG. 9) in that it involves etching the silicon oxide film and the low-κ film using a mask made of an organic material. That is, the etching performed in Experiment 2 corresponds to the process of forming the hole t illustrated in FIG. 12 (e), and the hole t is subsequently used to form the via V illustrated in FIG. 12 (f). In view of the above, an opening formed by the present etching process is referred to as "via" in the following descriptions for the purpose of illustration.

Detailed gas mixture supply conditions used in the present experiment are indicated below.
<Condition 2-3>

| Center region 143a | $CHF_3/N_2/Ar = 2.6/23.7/31$ sccm |
|---|---|
| Middle region 143b | $CHF_3/N_2/Ar = 9.9/89/58$ sccm |
| Edge region 143c | $CHF_3/N_2/Ar = 17.8/160/208$ sccm |
| Outer edge region 143d | $CHF_3/N_2/Ar = 30/0/346$ sccm |

<Condition 2-4>

| Center region 143a | $CHF_3/N_2/Ar = 2.6/23.7/31$ sccm |
|---|---|
| Middle region 143b | $CHF_3/N_2/Ar = 9.9/89/58$ sccm |
| Edge region 143c | $CHF_3/N_2/Ar = 17.8/160/208$ sccm |
| Outer edge region 143d | $CHF_3/N_2/Ar = 30/0/606$ sccm |

Also, other conditions commonly implemented under both condition 2-3 and condition 2-4 are indicated below.
<Common Conditions>

| Pressure within chamber 102 | 30 | mTorr |
|---|---|---|
| Gap G | 30 | mm |
| High frequency power supply power (40 MHz/13 MHz) | 560/0 | W |
| Upper electrode potential | 0 | V |
| Processing time | 128 | seconds |

Figure 19:
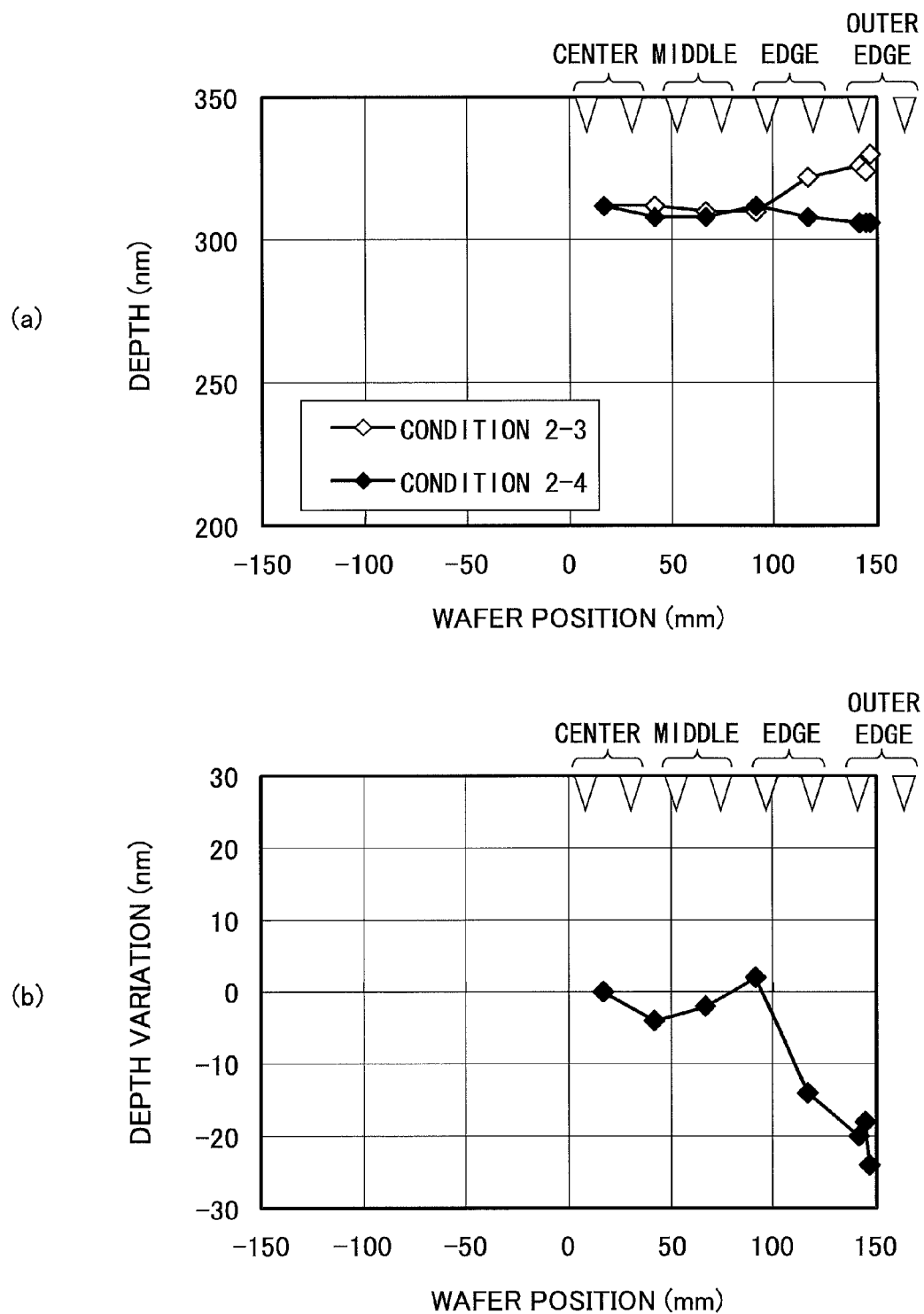
FIG. 19 illustrates graphs indicating other experimental results.

FIG. 19 illustrates the wafer in-plane uniformity of the cross-sectional shapes of vias etched under the above condition 2-3 and condition 2-4. Referring to FIG. 19 (a), under condition 2-3, vias get deeper toward the edge of the wafer (see graph with ◇ mark). On the other hand, under condition 2-4, the via depth at the relevant region is shallower; that is, improvement in the uniformity of the via depth within the wafer plane can be seen when condition 2-4 is used (see graph with ◆ mark). FIG. 19 (b) illustrates differences in the via depth between the case where condition 2-3 is used and the case where condition 2-4 is used. As can be appreciated from FIG. 19 (b), by switching the gas supply condition from condition 2-3 to condition 2-4, the via depth at the edge region 143c and the outer edge region 143d may be made substantially shallower. Particularly, at the outer edge region 143d, the via depth may be made approximately 25 nm shallower. Note, also, that no substantial change in the via depth can be seen at the wafer positions below the center region 143a and the middle region 143b even when the gas supply condition is switched from condition 2-3 to condition 2-4. Under condition 2-4, the supply rates of $N_2$ gas and Ar gas supplied from the outer edge region 143d are altered from condition 2-3. Thus, the change in the etch rate at wafer positions below the outer edge region 143d may be attributed to the change in the gas supply conditions for gas supplied from the outer edge region 143d. This result may be correlated with the above explanation with reference to FIG. 14 that in a case where the Peclet number is less than one throughout the entire wafer, by adjusting the gas supply conditions for the regions 143a-143d, the etch rate at wafer positions right below the region that was subject to the gas supply condition adjustment may be changed.

Experiment 3

In Experiment 3, gas supply conditions differing from those used in Experiment 2 were used to examine the wafer in-plane uniformity of the cross-sectional shapes of vias formed by etching. Specifically, the following two sets of gas mixture supply conditions were used to etch the vias. Note that other conditions used such as the pressure within the chamber 102 were identical to the common conditions used in Experiment 2.

<Condition 3-1>

| Center region 143a | $CHF_3/N_2/Ar$ = 2.6/23.7/31 sccm |
| --- | --- |
| Middle region 143b | $CHF_3/N_2/Ar$ = 9.9/89/115 sccm |
| Edge region 143c | $CHF_3/N_2/Ar$ = 17.8/160/208 sccm |
| Outer edge region 143d | $CHF_3/N_2/Ar$ = 30/267/346 sccm |

<Condition 3-2>

| Center region 143a | $CHF_3/N_2/Ar$ = 2.6/23.7/31 sccm |
| --- | --- |
| Middle region 143b | $CHF_3/N_2/Ar$ = 9.9/89/115 sccm |
| Edge region 143c | $CHF_3/N_2/Ar$ = 17.8/160/208 sccm |
| Outer edge region 143d | $CHF_3/N_2/Ar$ = 30/0/346 sccm |

FIG. 20 illustrates the results of Experiment 3. FIG. 20 (a) is an SEM image of a cross-section of a via formed by etching under condition 3-1, and FIG. 20 (b) is an SEM image of a cross-section of a via formed by etching under condition 3-2. Note that numerical values indicated in these SEM images represent wafer positions. FIG. 20 (c) is a graph indicating the via depth depending on the wafer position as measured from the SEM images. FIG. 20 (d) is a graph indicating the width of bottom portions of vias depending on the wafer position as measured from the SEM images.

As can be appreciated from FIG. 20 (c), under condition 3-1, the vias tend to become shallower toward the outer edge of the wafer; on the other hand, by changing the gas supply condition at the outer edge region 143d (i.e., switching to condition 3-2), the vias tend to become deeper toward the outer edge of the wafer. With respect to the width of the bottom portions of vias, as illustrated in FIG. 20 (d), under condition 3-1, the bottom width of vias tend to become wider toward the outer edge of the wafer; however, under condition 3-2, the bottom width of the vias remain substantially the same although a slight increase in the bottom width may be seen at the outer edge of the wafer. Specifically, under condition 3-1, the difference between the maximum value and the minimum value of the bottom width within a wafer plane may be approximately 16 nm. On the other hand, under condition 3-2, the difference may be reduced to approximately 4 nm. It can be appreciated from these results that the via profile (etching profile) may be adjusted by adjusting the gas supply condition at the outer edge region 143d. Note that even when the gas supply condition at the outer edge region 143d is adjusted, the via depth and the via bottom width at wafer positions corresponding to the edge region 143c may change as well owing to the effects of diffusion of the etching gas (gas mixture).

Experiment 4

In the following, Experiment 4 is described. In this experiment, etching was performed under the following three sets of conditions. Note that condition 4-1 indicated below is identical to the above condition 3-2. Certain gas supply conditions of condition 4-1 were changed under condition 4-2 and condition 4-3 indicated below, and resulting changes in the etching profiles were examined. Note that other conditions and the films subject to etching were identical to those used in Experiment 2.

<Condition 4-1>

| Center region 143a | $CHF_3/N_2/Ar$ = 2.6/23.7/31 sccm |
| --- | --- |
| Middle region 143b | $CHF_3/N_2/Ar$ = 9.9/89/115 sccm |
| Edge region 143c | $CHF_3/N_2/Ar$ = 17.8/160/208 sccm |
| Outer edge region 143d | $CHF_3/N_2/Ar$ = 30/0/346 sccm |

<Condition 4-2>

| Center region 143a | $CHF_3/N_2/Ar$ = 2.6/23.7/31 sccm |
| --- | --- |
| Middle region 143b | $CHF_3/N_2/Ar$ = 9.9/89/58 sccm |
| Edge region 143c | $CHF_3/N_2/Ar$ = 17.8/160/208 sccm |
| Outer edge region 143d | $CHF_3/N_2/Ar$ = 30/0/346 sccm |

<Condition 4-3>

| Center region 143a | $CHF_3/N_2/Ar$ = 2.6/23.7/31 sccm |
| --- | --- |
| Middle region 143b | $CHF_3/N_2/Ar$ = 9.9/89/58 sccm |
| Edge region 143c | $CHF_3/N_2/Ar$ = 17.8/160/208 sccm |
| Outer edge region 143d | $CHF_3/N_2/Ar$ = 30/0/606 sccm |

Figure 21:
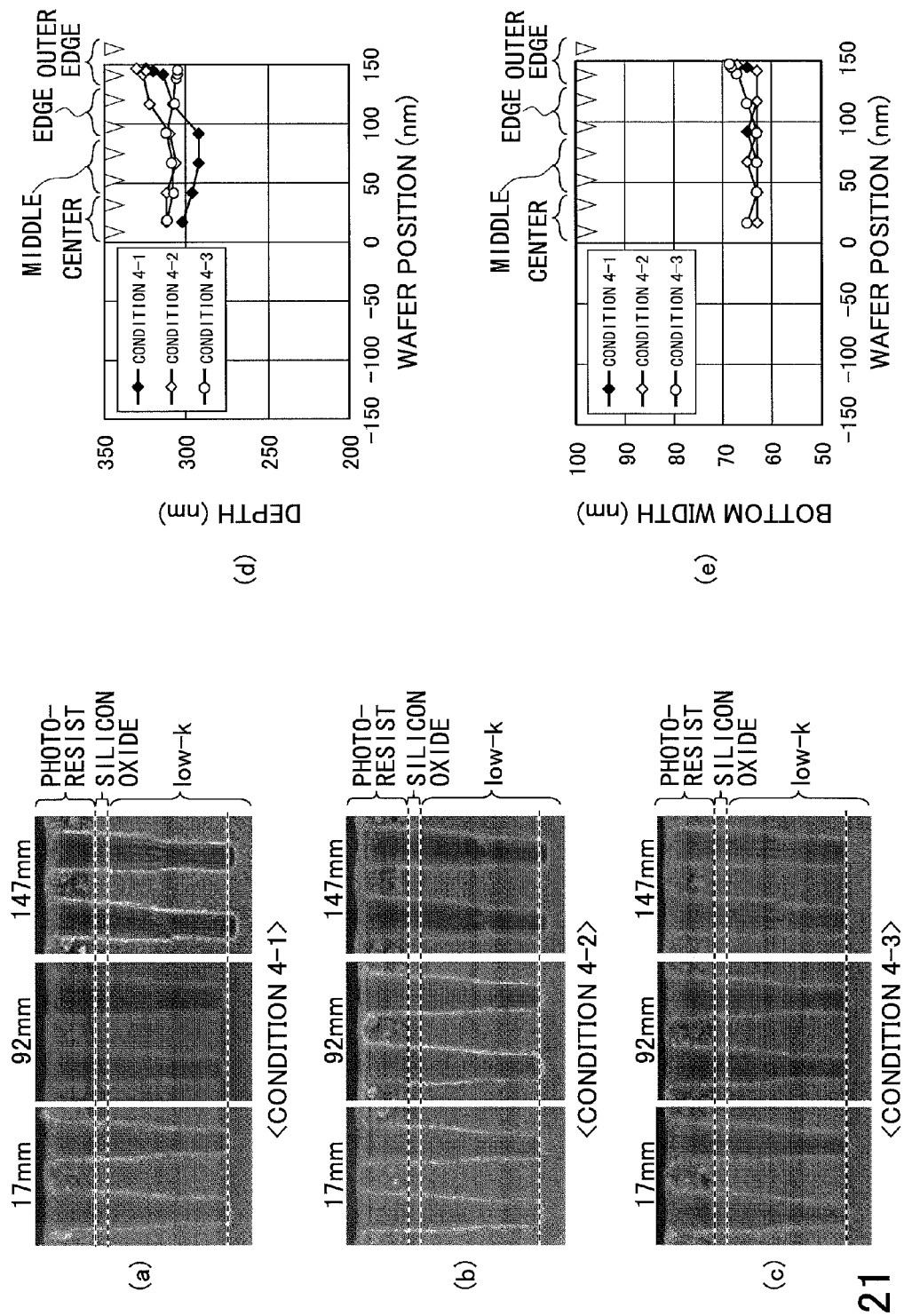
FIG. 21 illustrates other experimental results.

FIG. 21 (a) through FIG. 21 (c) illustrate cross-sections of vias formed under the above conditions, and FIG. 21 (d) and FIG. 21 (e) respectively illustrate the via depth depending on the wafer position and the via bottom width depending on the wafer position.

In comparing condition 4-1 and condition 4-2, the AR gas flow rate is reduced to 58 sccm under condition 4-2 (from 115 sccm under condition 4-1). As a result, as illustrated in FIG. 21 (d), while the vias become deeper as a whole under condition 4-2 compared to condition 4-1, the vias at wafer positions corresponding to the middle region 143b become relatively deeper under condition 4-2, meaning in-plane uniformity of the vias is improved. That is, the difference between the maximum value and the minimum value of the via depth is reduced from 32 nm (under condition 4-1) to 24 nm (under condition 4-2). When the Ar gas flow rate at the outer edge region 143d is increased to 606 sccm under condition 4-3 (from 346 sccm under condition 4-2), vias at wafer positions corresponding to the outer edge region 143d become shallower, and as a result, in-plane uniformity of the via depth within the wafer may be improved. That is, the difference between the maximum value and the minimum value of the via depth may be reduced from 24 nm (under condition 4-2) to 6 nm (under condition 4-3).

With respect to the via bottom depth, as illustrated in FIG. 21 (d), adequate in-plane uniformity within the wafer may be achieved under any of the above conditions.

As can be appreciated from the above, in-plane uniformity of via profiles within a wafer plane may be improved by adjusting gas supply conditions at the regions 143a-143d.

Experiment 5

In the following, Experiment 5 is described. In this experiment, etching was performed under the following three sets of conditions. Note that condition 5-1 indicated below is identical to the above condition 4-3. Certain gas supply conditions of condition 5-1 were changed under condition 5-2 and condition 5-3 indicated below, and resulting changes in the etching profiles were examined. Note that other conditions and the films subject to etching were identical to those used in Experiment 2.

<Condition 5-1>

| Center region 143a | $CHF_3/N_2/Ar$ = 2.6/23.7/31 sccm |
| Middle region 143b | $CHF_3/N_2/Ar$ = 9.9/89/58 sccm |
| Edge region 143c | $CHF_3/N_2/Ar$ = 17.8/160/208 sccm |
| Outer edge region 143d | $CHF_3/N_2/Ar$ = 30/0/606 sccm |

<Condition 5-2>

| Center region 143a | $CHF_3/N_2/Ar$ = 1.3/23.7/31 sccm |
| Middle region 143b | $CHF_3/N_2/Ar$ = 4.95/89/58 sccm |
| Edge region 143c | $CHF_3/N_2/Ar$ = 8.9/160/208 sccm |
| Outer edge region 143d | $CHF_3/N_2/Ar$ = 15/0/606 sccm |

<Condition 5-3>

| Center region 143a | $CHF_3/N_2/Ar$ = 1.3/23.7/31 sccm |
| Middle region 143b | $CHF_3/N_2/Ar$ = 4.95/89/58 sccm |
| Edge region 143c | $CHF_3/N_2/Ar$ = 8.9/160/208 sccm |
| Outer edge region 143d | $CHF_3/N_2/Ar$ = 25/0/606 sccm |

Figure 22:
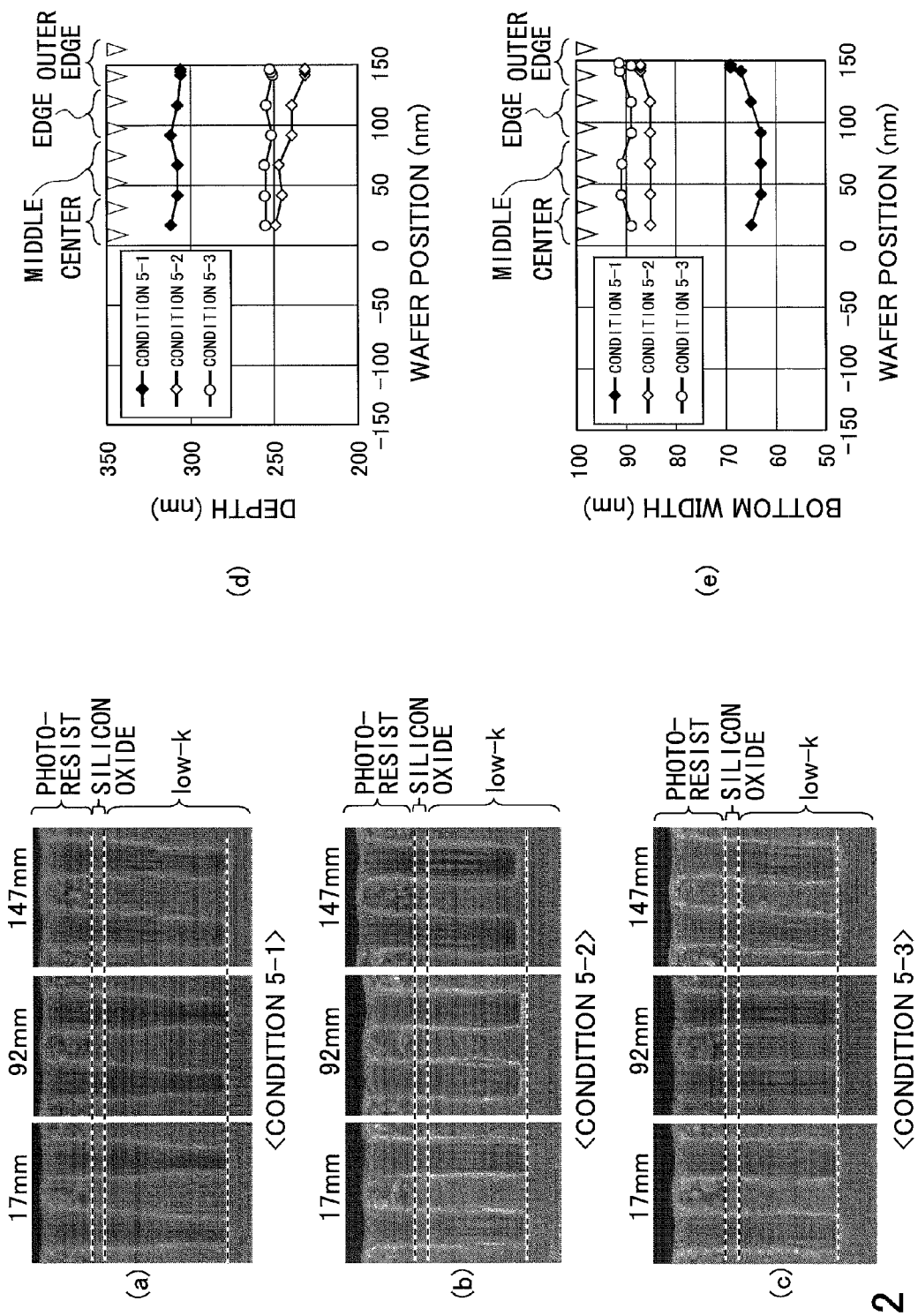
FIG. 22 illustrates other experimental results.

FIG. 22 (*a*) through FIG. 22 (*c*) illustrate cross-sections of vias formed under the above conditions, and FIG. 22 (*d*) and FIG. 22 (*e*) respectively illustrate the via depth depending on the wafer position and the via bottom width depending on the wafer position.

As can be appreciated from the above, under condition 5-2, the $CHF_3$ gas flow rates at the regions 143a-143d are reduced by half compared to the $CHF_3$ gas flow rates under condition 5-1. Note that other gas supply conditions for condition 5-1 and condition 5-2 are identical. By changing the gas supply conditions as described above, the vias become shallower overall and the vias at the outer edge of the wafer tend to become even shallower as illustrated in FIG. 22 (*d*). The vias become shallower because by reducing the $CHF_3$ gas flow rate by half, the amount of fluorine radicals is reduced and the amount of reaction between the silicon oxide film and the low-κ film is reduced.

Further, under condition 5-3, the Ar gas flow rate at the outer edge region 143d is increased (15 sccm) compared to condition 5-2 (25 sccm), and as a result, the vias at the outer edge of the wafer become relatively deeper and in-plane uniformity of the via depth can be improved. That is, the difference between the maximum value and the minimum value of the via depth is 6 nm under condition 5-1, 18 nm under condition 5-2, and 4 nm under condition 5-3.

With respect to the via bottom width, the difference between the maximum value and the minimum value may be adequately small under any of the above conditions (2 nm to 6 nm).

As can be appreciated from the above, in-plane uniformity of via profiles within a wafer plane may be improved by adjusting gas supply conditions at the regions 143a-143d.

Although the present invention is described above with reference to certain illustrative embodiments, the present invention is not limited to these embodiments but includes numerous variations and modifications that may be made without departing from the scope of the present invention.

For example, a processing object that may be etched by the plasma etching apparatus 100 of the present embodiment is not particularly limited. In one specific example, a wafer made of a silicon substrate and having a silicon dioxide ($SiO_2$) film, an etching film made of a polysilicon film, a single-layer or multi-layer mask film, an anti-reflection film (BARC: Bottom Anti-Reflective Coating), and a photoresist film formed thereon may be used. In this case, the resist film may be exposed and developed beforehand to have a predetermined pattern formed thereon.

Also, the number of annular partition wall members 145 arranged within the plasma etching apparatus 100 is not particularly limited as long as at least one is provided. For example, three annular partition wall members may be provided as illustrated in FIG. 3. In the case of performing plasma etching on a wafer W with a diameter of 300 mm, three annular partition wall members 145 are preferably provided (i.e., the buffer chamber 143 is preferably divided into four zones) to facilitate control of the etching gas and achieve in-plane etching uniformity at the same time. Note that by providing N annular partition wall members 145, the buffer chamber 143 may be divided into N+1 regions.

Also, the wiring layer 10 (see FIG. 10) may be made of metal including copper (Cu) or a conductive polysilicon, for example.

The present application is based on and claims the benefit of priority of Japanese Patent Application No. 2011-210945 filed on Sep. 27, 2011; U.S. Provisional Application No. 61/549,327 filed on Oct. 20, 2011; Japanese Patent Application No. 2011-214927 filed on Sep. 29, 2011, and U.S. Provisional Application No. 61/549,350 filed on Oct. 20, 2011, the entire contents of which are herein incorporated by reference.

The invention claimed is:

1. A plasma etching method for etching a substrate corresponding to an etching object within an etching apparatus that includes a supply rate adjustment unit for adjusting a supply rate of an etching gas supplied to the substrate, a temperature adjustment unit for adjusting a temperature of the substrate placed on a stage along a radial direction, and a plasma generating unit for generating plasma within a space between the supply rate adjustment unit and the stage, the plasma etching method comprising:

a control step in which the temperature adjustment unit controls the temperature of the substrate to be uniform within a substrate plane of the substrate at a first temperature; and an adjustment step in which the supply rate adjustment unit adjusts a concentration distribution of active species contained in the plasma generated by the plasma generation unit within the space above the substrate, wherein the adjustment step adjusts the supply rate of the etching gas according to whether a supply region on the substrate to which the etching gas is supplied corresponds to a region where a Peclet number, calculated by uL/D, is less than one or greater than one, wherein u denotes an etching gas flow rate, D denotes an etching gas diffusion coefficient within the space above the substrate corresponding to a radial edge side portion of the stage positioned radially outward with respect to a radial center side portion of the stage, and L denotes a distance between the radial edge side portion and the substrate.

2. The plasma etching method as claimed in claim 1, wherein the supply rate adjustment unit includes a first supply unit that supplies the etching gas to the radial center side portion of the stage and a second supply unit that supplies the etching gas to the radial edge side portion of the stage;

in the adjustment step, the supply rate adjustment unit adjusts the supply rate of the etching gas supplied by the second supply unit when an effect of diffusion of the supplied etching gas on the concentration distribution of the active species contained in the plasma is greater than an effect of flow of the supplied etching gas on the concentration distribution of the active species contained in the plasma at the supply region to which the etching gas is supplied from the second supply unit; and the supply rate adjustment unit adjusts the supply rate of the etching gas supplied from the first supply unit when the effect of flow of the supplied etching gas on the concentration distribution of the active species contained in the plasma is greater than the effect of diffusion of the supplied etching gas on the concentration distribution of the active species contained in the plasma at the supply region to which the etching gas is supplied from the second supply unit.

3. The plasma etching method as claimed in claim 1, further comprising:
   a step of changing the etching gas; and
   a step in which the temperature adjustment unit controls the temperature of the substrate to be uniform within the substrate plane at a second temperature that is different from the first temperature according to the change in the etching gas.

4. The plasma etching method as claimed in claim 1, wherein an effect of diffusion of the supplied etching gas on the concentration distribution of the active species in the plasma is greater than an effect of flow of the supplied etching gas on the concentration distribution of the active species at the region where the Peclet number is less than one, and the effect of flow of the etching gas on the concentration distribution of the active species is greater than the effect of diffusion on the concentration distribution of the active species at the region where the Peclet number is greater than one.

5. The plasma etching method as claimed in claim 1, wherein the adjustment step adjusts the supply rate of the etching gas such that there is attained an uniformity of an etching rate within the substrate plane of the substrate.

6. A plasma etching method for etching a substrate that includes a first wiring layer on which an insulating layer and a metal layer are successively formed, a metal mask layer having a first opening for defining a trench for a second wiring layer, and a second mask layer having a second opening that is smaller than the first opening for defining a via for interconnecting the first wiring layer and the second wiring layer, the first opening being formed by etching the metal layer formed on the first wiring layer, and the second opening being formed by etching a planarization layer arranged on the insulating layer and covering the metal mask layer, the plasma etching method comprising:
   a first etching step of performing plasma etching on the insulating layer using the second mask layer and forming an opening having a depth that is less than a thickness of the insulating layer within a plasma etching apparatus; and
   a second etching step of performing plasma etching on the insulating film using the metal mask layer to form the trench and deepening the opening to form the via within the same plasma etching apparatus;
   wherein the first etching step and the second etching step include adjusting an etching gas supply condition according to whether a supply position on the substrate to which the etching gas is supplied corresponds to a position where a Peclet number calculated by uL/D is less than one or greater than one, wherein u denotes an etching gas flow rate, and D denotes an etching gas diffusion coefficient within the space above the substrate corresponding to the radial edge side portion of the stage positioned radially outward with respect to a radial center side portion of the stage, and L denotes a distance between the radial edge side portion and the substrate.

7. The plasma etching method as claimed in claim 6, wherein the first etching step and the second etching step include
   supplying the etching gas toward the substrate from the radial center side portion of the substrate and the radial edge side portion of the substrate;
   adjusting the etching gas supply condition for the etching gas supplied from the radial edge side portion when an effect of diffusion of the supplied etching gas on the concentration distribution of the active species contained in the plasma is greater than an effect of flow of the supplied etching gas on the concentration distribution of the active species contained in the plasma within a space above the substrate corresponding to the radial edge side portion; and
   adjusting the etching gas supply condition for the etching gas supplied from the radial center side portion when the effect of flow of the supplied etching gas on the concentration distribution of the active species contained in the plasma is greater than the effect of diffusion of the supplied etching gas on the concentration distribution of the active species contained in the plasma within a space above the substrate corresponding to the radial edge side portion.

8. The plasma etching method as claimed in claim 6, wherein the etching gas supply condition corresponds to an etching gas flow rate.

9. A semiconductor device manufacturing method comprising:
   a step of performing the plasma etching method as claimed in claim 6; and
   a step of filling the trench and the via formed by the plasma etching method with metal in a damascene process to form a via plug and the second wiring layer.

10. The plasma etching method as claimed in claim 6, wherein an effect of diffusion of the supplied etching gas on the concentration distribution of the active species is greater than an effect of flow of the supplied etching gas on the concentration distribution of the active species when the Peclet number is less than one, and the effect of flow of the supplied etching gas on the concentration distribution of the active species is greater than the effect of diffusion of the supplied etching gas on the concentration distribution of the active species when the Peclet number is greater than one.

11. The plasma etching method as claimed in claim 6, wherein the etching gas corresponds to a gas mixture containing a fluorine gas and an inert gas.

12. The plasma etching method as claimed in claim 11, wherein the etching gas contains oxygen gas.

* * * * *